(12) United States Patent
Liu et al.

(10) Patent No.: US 11,275,130 B2
(45) Date of Patent: Mar. 15, 2022

(54) MAGNETIC SENSOR BRIDGE USING DUAL FREE LAYER

(71) Applicant: Western Digital Technologies, Inc., San Jose, CA (US)

(72) Inventors: Xiaoyong Liu, San Jose, CA (US); Quang Le, San Jose, CA (US); Zhigang Bai, Fremont, CA (US); Daniele Mauri, San Jose, CA (US); Zhanjie Li, Pleasanton, CA (US); Kuok San Ho, Emerald Hills, CA (US); Thao A. Nguyen, San Jose, CA (US); Rajeev Nagabhirava, Santa Clara, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/912,500

(22) Filed: Jun. 25, 2020

(65) Prior Publication Data
US 2021/0405131 A1 Dec. 30, 2021

(51) Int. Cl.
*G01R 33/14* (2006.01)
*G01R 33/09* (2006.01)
*G01R 27/14* (2006.01)

(52) U.S. Cl.
CPC .......... *G01R 33/091* (2013.01); *G01R 27/14* (2013.01); *G01R 33/093* (2013.01)

(58) Field of Classification Search
CPC ...... G01R 15/20; G01R 15/205; G01R 27/14; H01L 43/08; G11B 5/295
See application file for complete search history.

(56) References Cited

U.S. PATENT DOCUMENTS 6,501,678 B1  12/2002  Lenssen et al.
6,771,472 B1   8/2004  Mao et al.
(Continued)

FOREIGN PATENT DOCUMENTS

EP   3006951 A1    4/2016
EP   3224639 A1   10/2017

OTHER PUBLICATIONS

Abstract, "Institute of Electro-Optical Sciences and Technology National Taiwan Normal University"; https://cutt.ly/hrHnzxq (1page).
(Continued)

*Primary Examiner* — Son T Le
(74) *Attorney, Agent, or Firm* — Patterson & Sheridan, LLP; Steven H. Versteeg

(57) ABSTRACT

The present disclosure generally relates to sensor device, such as a magnetic sensor bridge, that utilizes a dual free layer (DFL) structure. The device includes a plurality of resistors that each includes the same DFL structure. Adjacent the DFL structure is a magnetic structure that can include a permanent magnet, an antiferromagnetic (AFM) layer having a synthetic AFM (SAF) structure thereon, a permanent magnetic having a SAF structure thereon, or an AFM layer having a ferromagnetic layer thereon. The DFL structures are aligned with different layers of the magnetic structures to differentiate the resistors. The different alignment and/or different magnetic structures result in a decrease in production time due to reduced complexity and, thus, reduces costs.

23 Claims, 13 Drawing Sheets

(56) References Cited

U.S. PATENT DOCUMENTS

| | | |
|---|---|---|
| 9,069,033 B2 | 6/2015 | Chen et al. |
| 9,431,031 B1* | 8/2016 | Xiao ................ G11B 5/4886 |
| 9,640,753 B2 | 5/2017 | Sun et al. |
| 2006/0152859 A1* | 7/2006 | Childress ............ B82Y 25/00 |
| | | 360/324.2 |
| 2012/0134057 A1* | 5/2012 | Song ................ G11B 5/3912 |
| | | 360/319 |
| 2017/0176545 A1* | 6/2017 | Deak ................ G01R 33/0206 |
| 2017/0222137 A1 | 8/2017 | Raberg |
| 2017/0322052 A1 | 11/2017 | Paul et al. |

OTHER PUBLICATIONS

Ferreira, Ricardo et al.; "2-Axis Magnetometers Based on Full Wheatstone Bridges Incorporating Magnetic Tunnel Junctions Connected in Series"; IEEE Transactions on Magnetics, vol. 48, No. 11, Nov. 2012 (4 pages).

Han, X. F. et al. "Nano-scale Patterned Magnetic Tunnel Junction and its Device Applications"; AAPPS Bulletin, vol. 18, No. 6, Dec. 2008 (9 pages).

* cited by examiner

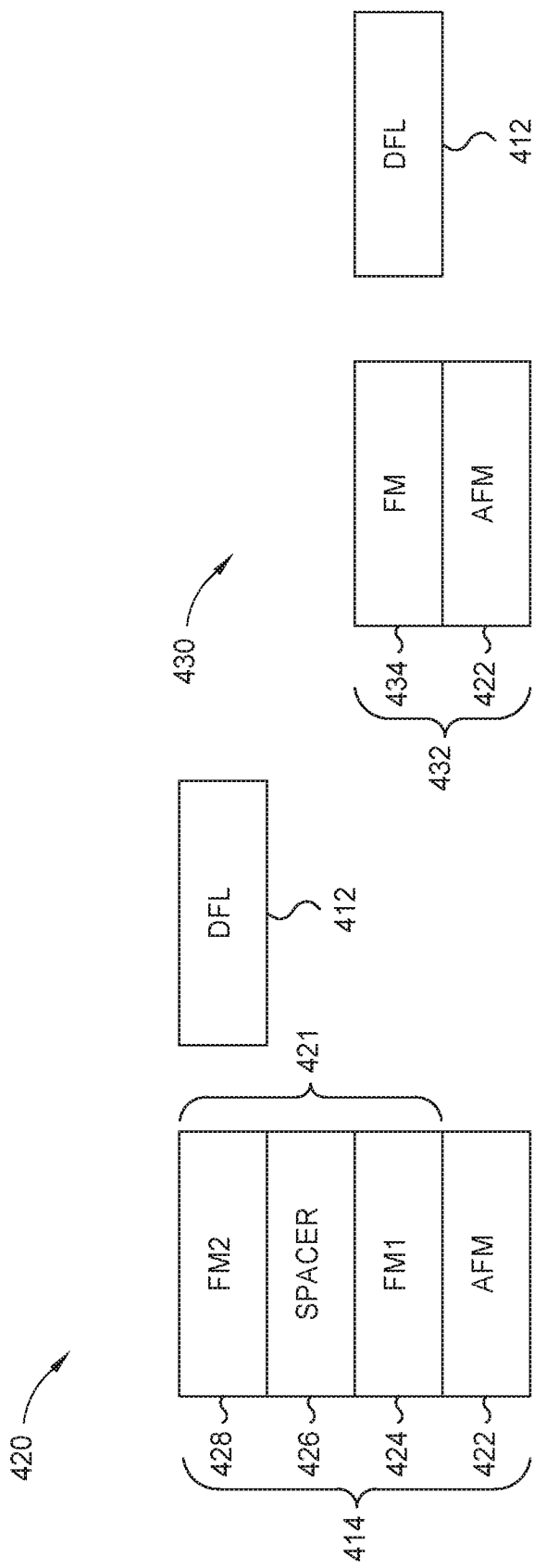

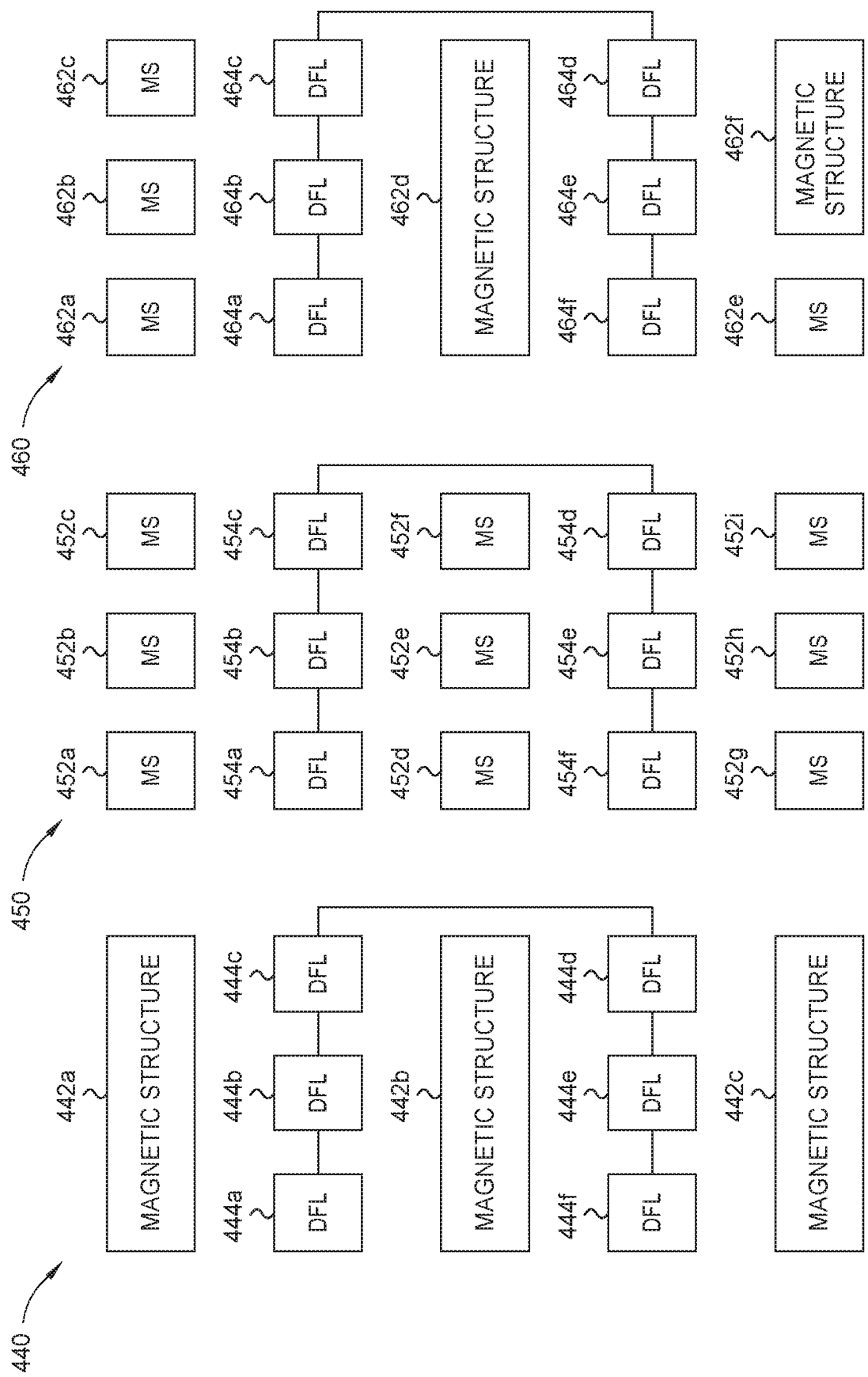

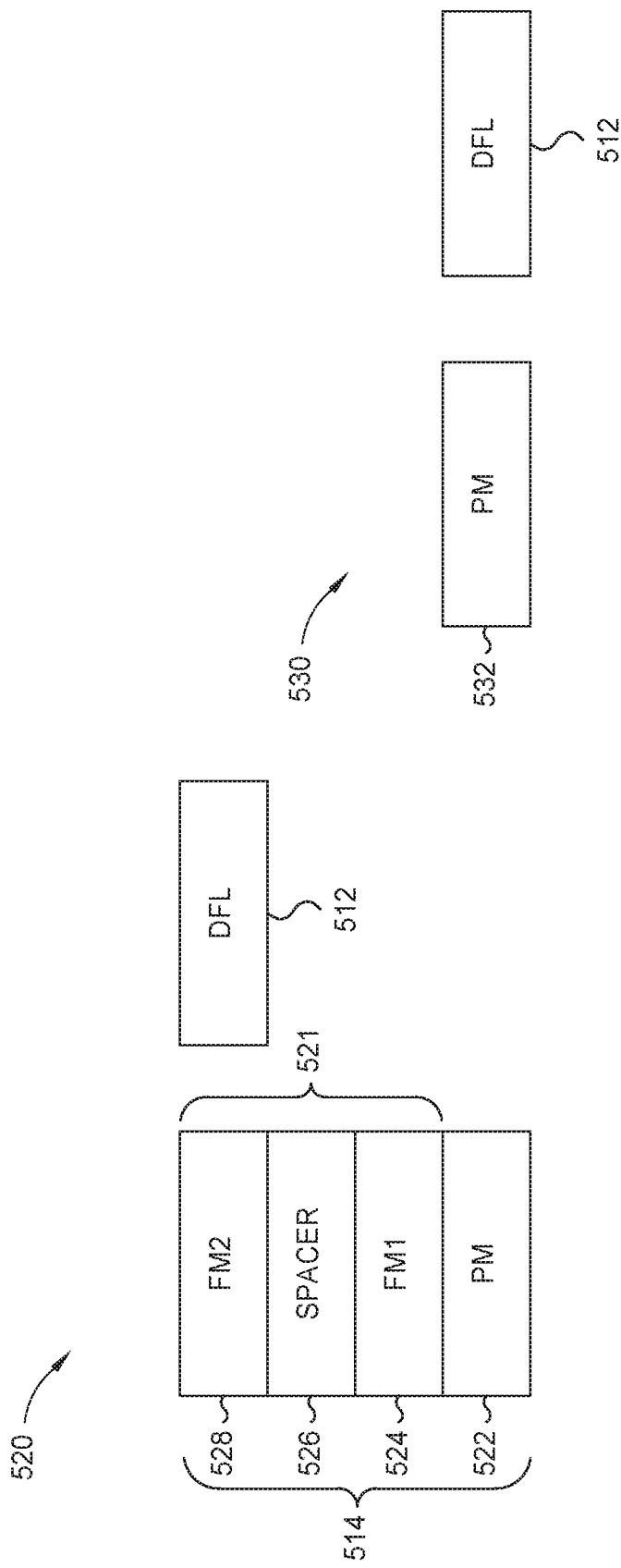

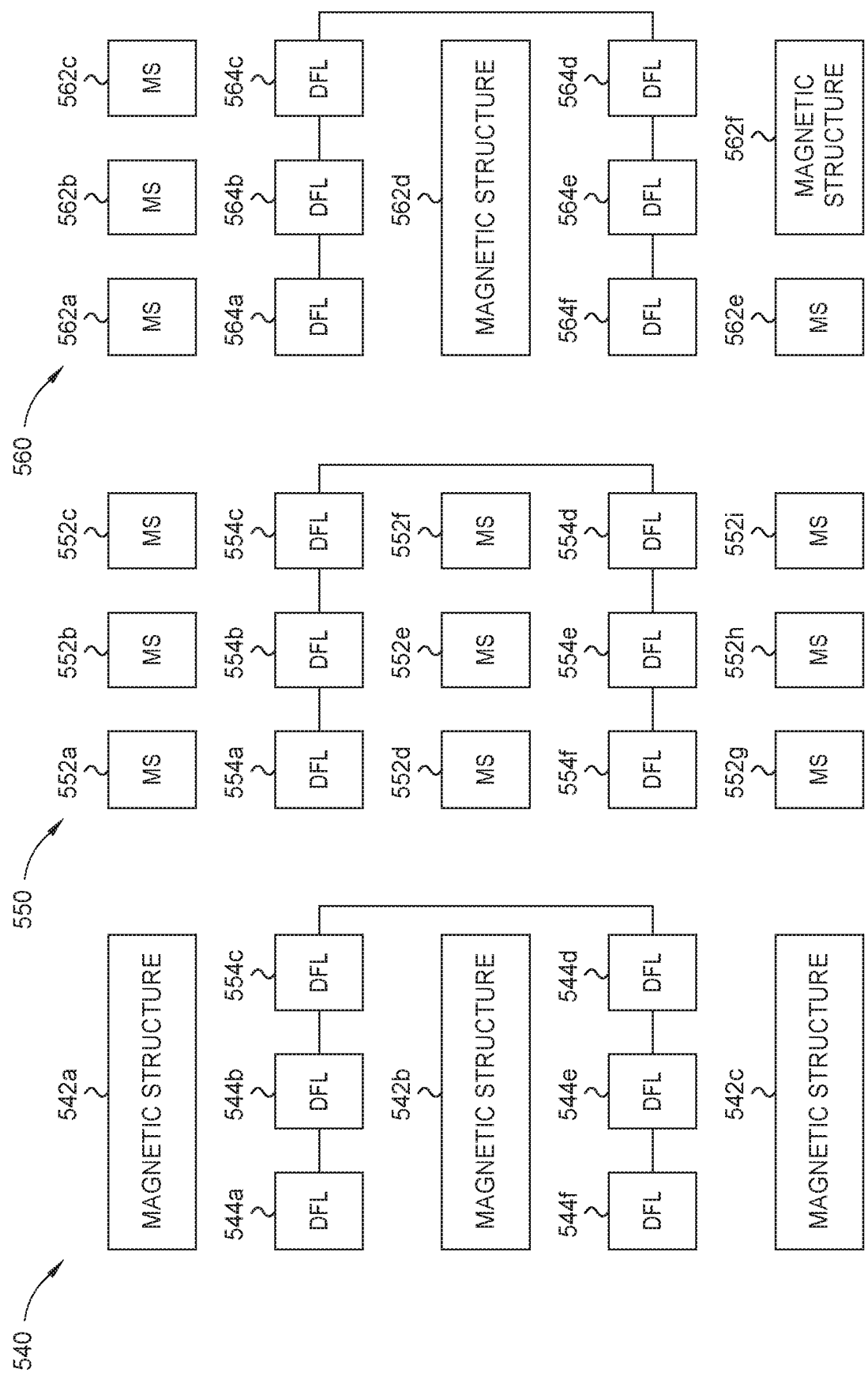

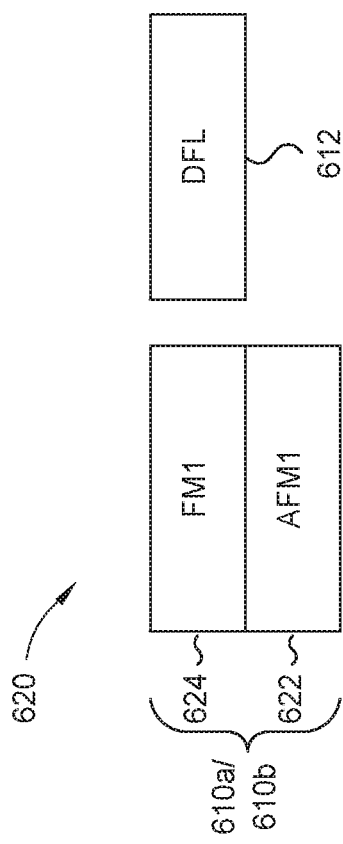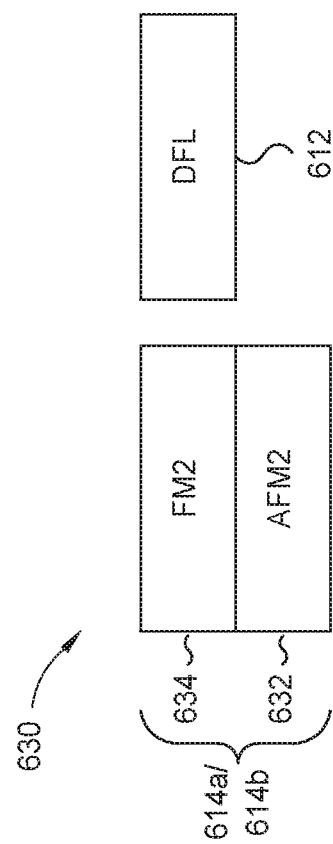

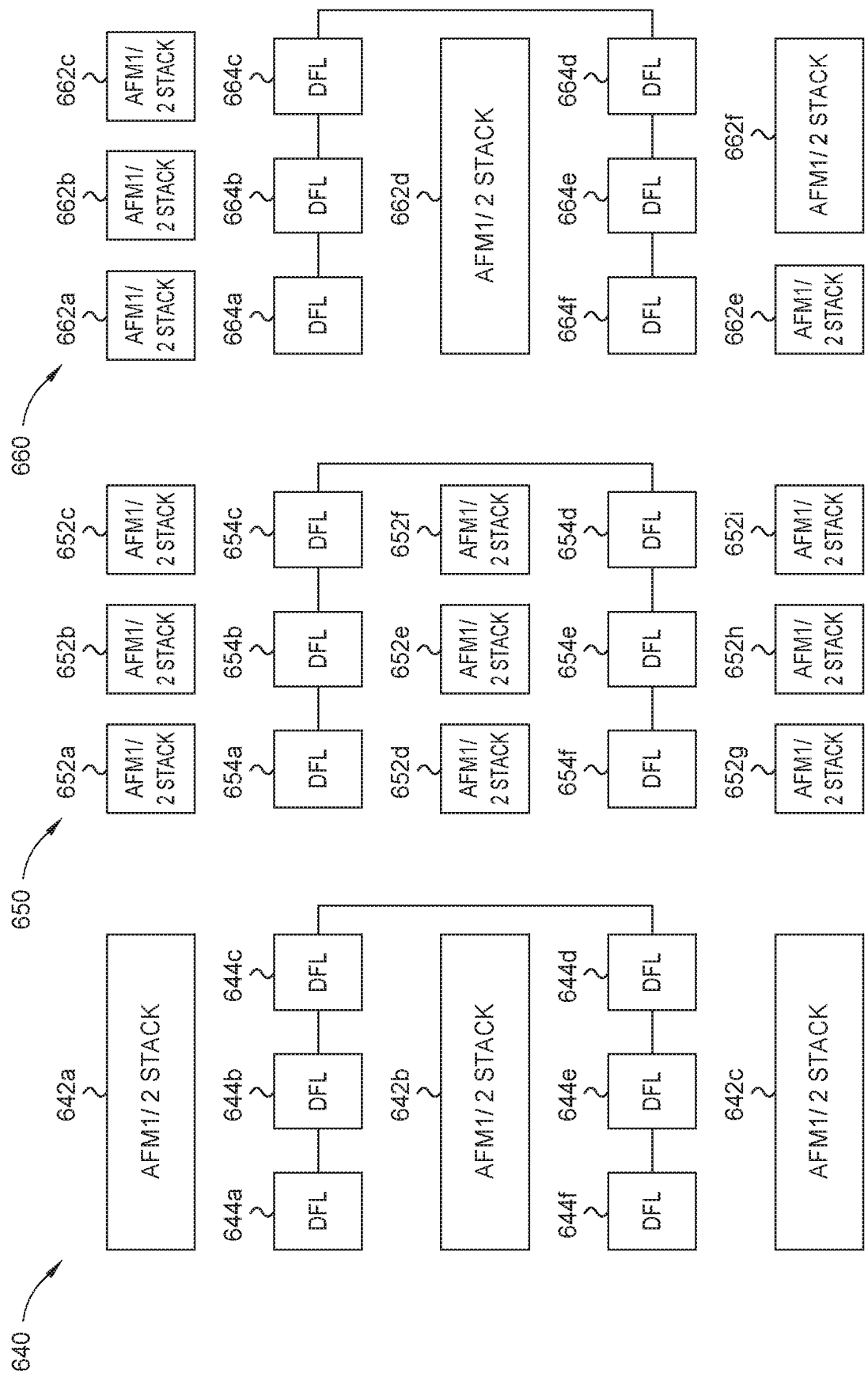

MAGNETIC SENSOR BRIDGE USING DUAL FREE LAYER

BACKGROUND OF THE DISCLOSURE

Field of the Disclosure

Embodiments of the present disclosure generally relate to a Wheatstone bridge array and a method of manufacture thereof.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as magnetic sensors. Magnetic sensors can include Hall effect magnetic sensors, anisotropy magnetoresistive sensors (AMR), giant magnetoresistive (GMR) sensors, and tunnel magnetoresistive (TMR) sensors. The TMR sensor has very high sensitivity compared to other magnetic sensors.

The Wheatstone bridge array has a linear output signal and resists the environment temperature. Any temperature change in the Wheatstone bridge array is canceled. The Wheatstone bridge array has four resistors. Two of the resistors have identical resistance, while the remaining two resistors have identical resistances relative to each other, but different from the original two resistors.

In conventional GMR or TMR based Wheatstone bridge sensors, achieving the different resistances for the resistors is achieved by having opposite pinning directions for two of the resistors relative to the other two resistors. To obtain different pinning directions, different sensor stacks may be used or specialized annealing, but fabricating two different sensors and specialized annealing increases production time, which can be expensive, complex, and time-consuming.

Therefore, there is a need in the art for an improved Wheatstone bridge array.

SUMMARY OF THE DISCLOSURE

The present disclosure generally relates to sensor device, such as a magnetic sensor bridge, that utilizes a dual free layer (DFL) structure. The device includes a plurality of resistors that each includes the same DFL structure. Adjacent to the DFL structure is a magnetic structure that can include a permanent magnet, an antiferromagnetic (AFM) layer having a synthetic antiferromagnetic AFM (SAF) structure thereon, a permanent magnetic having a SAF structure thereon, or an AFM layer having a ferromagnetic layer thereon. The DFL structures are aligned with different layers of the magnetic structures to differentiate the resistors. The different alignment and/or different magnetic structures result in a decrease in production time due to reduced complexity and, thus, reduces costs.

In one embodiment, a sensor device comprises: a first resistor comprising: at least one first dual free layer (DFL) sensor; and at least one first magnetic structure, wherein each first magnetic structure comprises: a first antiferromagnetic (AFM) layer; and a synthetic antiferromagnetic (SAF) structure disposed over the first AFM layer, wherein the at least one first DFL sensor is linearly aligned with the SAF structure when viewed in cross-section; and a second resistor comprising: at least one second DFL sensor; and at least one second magnetic structure, wherein each second magnetic structure comprises: a second AFM layer; and a ferromagnetic layer disposed over the second AFM layer. The at least one second DFL sensor is linearly aligned with the ferromagnetic layer when viewed in cross-section.

In another embodiment, a sensor device comprises: a first resistor comprising: at least one first dual free layer (DFL) sensor; and at least one magnetic structure, wherein each magnetic structure comprises: a first permanent magnet; and a synthetic antiferromagnetic (SAF) structure disposed over the first permanent magnet, wherein the at least one first DFL sensor is linearly aligned with the SAF structure when viewed in cross-section; and a second resistor comprising: at least one second DFL sensor; and at least one second permanent magnet, wherein the at least one second DFL sensor is linearly aligned with the at least one second permanent magnet when viewed in cross-section.

In another embodiment, a sensor device comprises: at least one first resistor comprising: at least one first dual free layer (DFL) sensor; and at least one first magnetic structure, wherein each first magnetic structure comprises: a first antiferromagnetic (AFM) layer comprising a first material; and a first ferromagnetic layer disposed over the first AFM layer; and at least one second resistor comprising: at least one second DFL sensor; and at least one second magnetic structure, wherein each second magnetic structure comprises: a second AFM layer comprising a second material, wherein the second material is different from the first material; and a second ferromagnetic layer disposed over the second AFM layer, wherein the second ferromagnetic layer is the same or different from the first ferromagnetic layer. The at least one first DFL sensor is linearly aligned with the first ferromagnetic layer when viewed in cross-section. The at least one second DFL sensor is linearly aligned with the second ferromagnetic layer when viewed in cross-section.

In another embodiment, a method comprises: forming a plurality of dual free layer sensors for a plurality of resistors; covering at least one first resistor of the plurality of resistors, wherein at least one second resistor of the plurality of resistors remains uncovered; forming either a first permanent magnet or a first antiferromagnetic layer adjacent the dual free layer sensor of the at least one second resistor; uncovering the at least one first resistor; covering the at least one second resistor; forming either a second permanent magnet or a second antiferromagnetic layer adjacent the dual free layer sensor of the at least one first resistor; uncover the at least one second resistor; and perform bridge pinning reset.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A-4F are schematic illustrations of a sensor device according to one embodiment.

FIGS. 5A-5F are schematic illustrations of a sensor device according to another embodiment.

FIGS. 6A-6F are schematic illustrations of a sensor device according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to sensor device, such as a magnetic sensor bridge, that utilizes a dual free layer (DFL) structure. The device includes a plurality of resistors that each includes the same DFL structure. Adjacent the DFL structure is a magnetic structure that can include a permanent magnet, an antiferromagnetic (AFM) layer having a synthetic antiferromagnetic (SAF) structure thereon, a permanent magnetic having a SAF structure thereon, or an AFM layer having a ferromagnetic layer thereon. The DFL structures are aligned with different layers of the magnetic structures to differentiate the resistors. The different alignment and/or different magnetic structures result in a decrease in production time due to reduced complexity and, thus, reduces costs.

Figure 1:
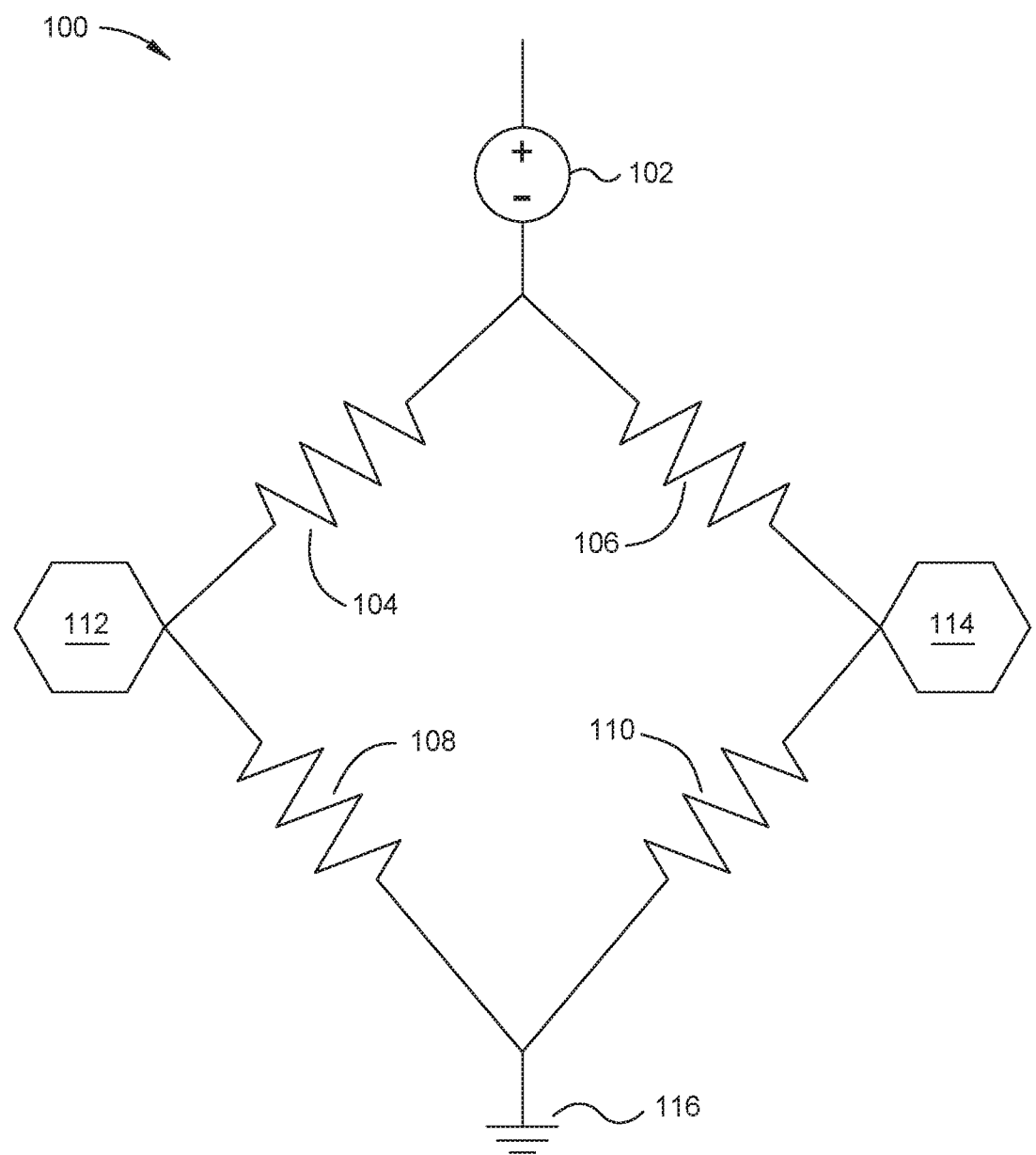
FIG. 1 is a schematic illustration of a Wheatstone bridge array design.

FIG. 1 is a schematic illustration of a Wheatstone bridge array 100 design. The array 100 includes a bias source 102, a first resistor 104, a second resistor 106, a third resistor 108, a fourth resistor 110, a first node 112 for lead connection, a second node 114 for lead connection, and a ground connection 116. A bias voltage is applied across the array from the bias source 102 to the ground connection 116. The first node 112 and the second node 114 sense the output of the applied voltage. Any temperature change from the resistors 104, 106, 108, 110 can be cancelled.

As discussed herein, the resistors 104, 106, 108, 110 each includes a DFL sensor. In one embodiment, resistors 104, 110 are identical to each other, and resistors 106, 108 are identical to each other yet different from resistors 104, 110. For a DFL sensor in array 100, the RA for the array 100 is around 100 Ohms microns$^2$.

Typical magnetic field sensors use MR (magnetoresistance) devices in a Wheatstone bridge circuit. The sensor requires MR devices to change differently in the bridge. As discussed herein, a new method to make a magnetic field sensor is to fabricate identical DFL sensors, yet utilize different magnetic structures adjacent thereto to differentiate the resistors. The reliability and performance of the DFL sensors determine the magnetoresistance response. In this way, combined with different magnetic structures adjacent DFL sensors, a perfect Wheatstone bridge design for a magnetic field sensor can be fabricated.

Figure 2:
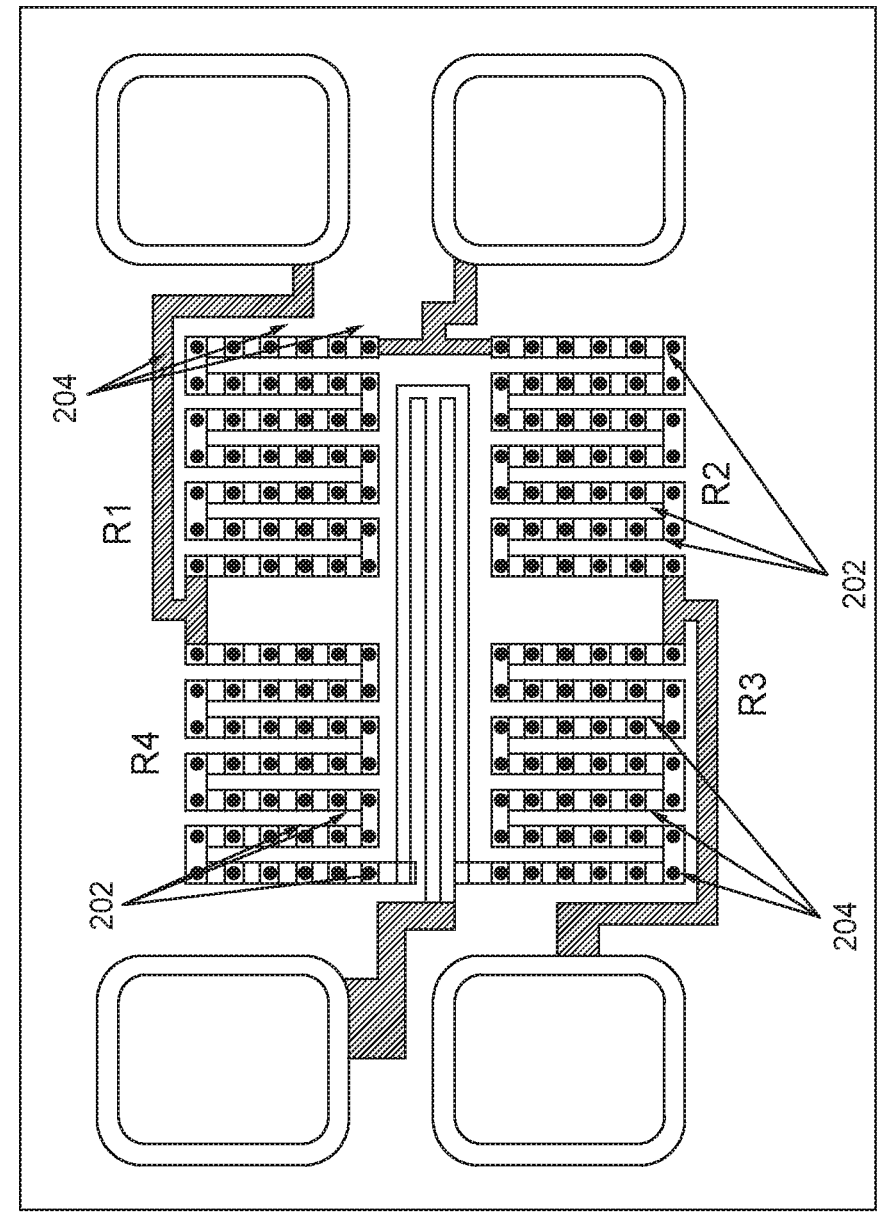
FIG. 2 is a schematic illustration of a Wheatstone bridge array with multiple TMR structures for each resistor.

FIG. 2 is a schematic illustration of a Wheatstone bridge array 200 with multiple DFL sensors for each resistor R1, R2, R3, R4. R1 may correspond to resistor 104; R2 may correspond to resistor 106; R3 may correspond to resistor 110; and R4 may correspond to resistor 108. When the working field bias is set to 0, then R1=R2=R3=R4. Additionally, the resistors R1 and R3 are distinct from resistors R2 and R4 based upon the magnetic structures adjacent the DFL sensors to provide two different magnetoresistances responses.

In the array 200, each resistor R1, R2, R3, R4 includes a plurality of magnetic structures adjacent DFL sensors. More specifically, in one embodiment, resistors R1 and R3 include a plurality of DFL sensors with adjacent magnetic structures 204 and resistors R2 and R4 include a plurality of DFL sensors with adjacent magnetic structures 202.

Figure 3:
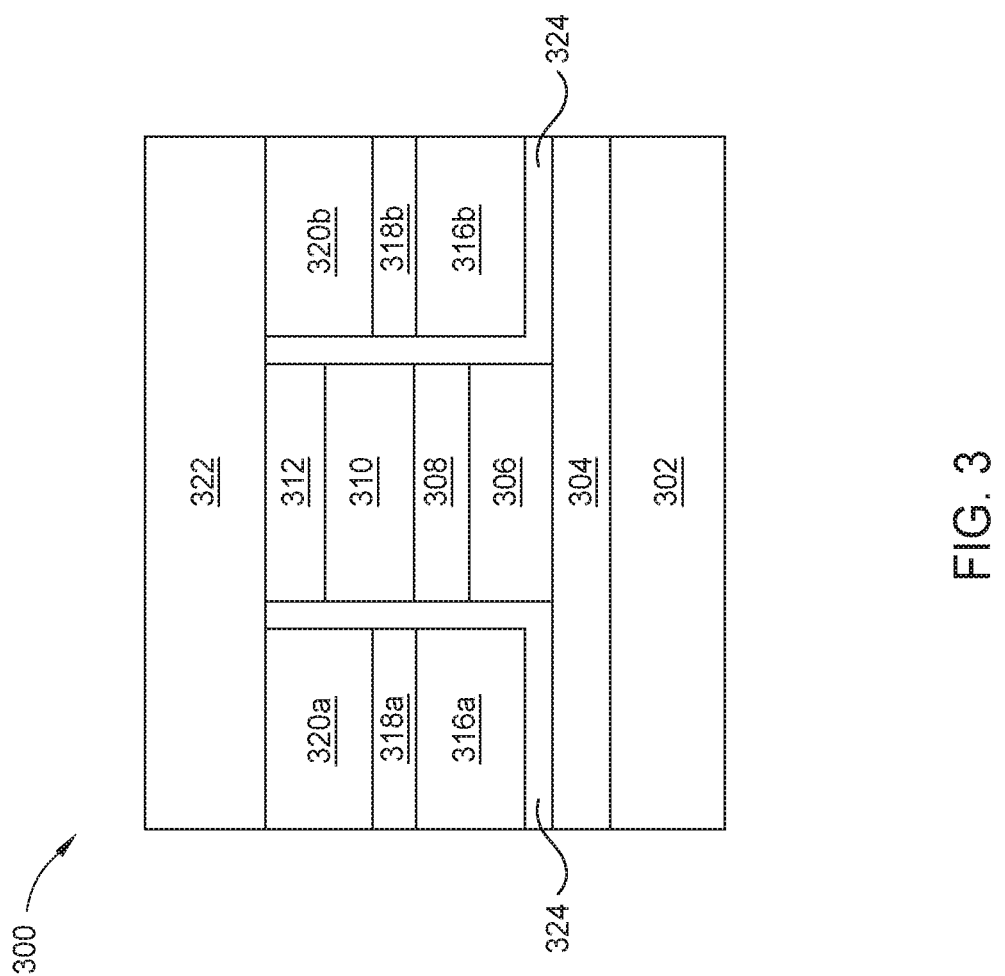
FIG. 3 is a cross sectional view of a single read head of a dual free layer (DFL) sensor.

FIG. 3 is a cross-sectional view of a dual free layer (DFL) sensor 300. The DFL sensor 300 includes a bottom lead (S1) 302, a seed layer 304, a first free layer (FL) 306, a barrier layer 308, a second FL 310, a cap 312, a top lead (S2) 322, and insulation material 324. It is understood that other materials not listed for each of the layers described herein are contemplated, and the embodiments discussed herein are not limited to the materials listed for each of the layers of the DFL sensor.

The S1 302 and the S2 322 each includes an electrically conductive material selected from the group that includes copper (Cu), tungsten (W), tantalum (Ta), aluminum (Al), and alloys thereof. The thickness of each of the S1 302 and the S2 322 may be between about 20 nm and about 500 nm. Additionally, it is to be understood that while Cu, W, Ta, and Al have been exemplified as the S1 302 and S2 322 materials, other materials are contemplated, and the embodiments discussed herein are not limited to Cu, W, Ta, or Al for the S1 302 and the S2 322.

A seed layer 304 is formed on the S1 302. The seed layer 304 is deposited by well-known deposition methods such as electroplating, physical vapor deposition (PVD), or atomic layer deposition (ALD) or chemical vapor deposition (CVD). The seed layer 304 includes a material selected from the group that includes tantalum (Ta), tungsten (W), ruthenium (Ru), and alloys thereof. Additionally, it is to be understood that while Ta, W, and Ru have been exemplified as the seed layer 304 materials, other materials are contemplated, and the embodiments discussed herein are not limited to Ta, W, or Ru for the seed layer 304.

The first FL 306 is formed on the seed layer 304. The first FL 306 includes a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The first FL 306 may be formed by well-known deposition methods such as sputtering. Additionally, it is to be understood that while CoFe/CoFeB/Ta/NiFe has been exemplified as the first FL 306 material, other materials are contemplated, and the embodiments discussed herein are not limited to CoFe/CoFeB/Ta/NiFe for the first FL 306.

The barrier layer 308 is formed on the first FL 306. The barrier layer 308 includes a material such as magnesium oxide (MgO) with a thickness of between about 10 Angstroms to about 20 Angstroms. It is to be understood that while MgO is exemplified as the barrier layer 308, other insulating materials are contemplated, and the embodiments discussed herein are not limited to MgO for the barrier layer 308.

The second FL 310 is formed on the barrier layer 308. The second FL 310 includes a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The second FL 310 may be formed by well-known deposition methods such as sputtering. Additionally, it is to be understood that while CoFe/CoFeB/Ta/NiFe has been exemplified as the second FL 310 material, other materials are contemplated, and the embodiments discussed herein are not limited to CoFe/CoFeB/Ta/NiFe for the second FL 310. The magnetic moments for the first FL 306 and the second FL 310 may be antiparallel due to the antiparallel biasing from the synthetic antiferromagnetic (SAF) soft bias (SB) further described below.

The cap 312 is formed on the second FL 310. The cap 312 includes a material selected from the group that includes tantalum (Ta), ruthenium (Ru), titanium (Ti), and other non-magnetic, electrically conductive materials. The cap 312 may be formed by well-known deposition methods such as sputtering. The cap 312 may have a thickness of between about 10 Angstroms to about 100 Angstroms. Additionally, it is to be understood that while Ta, Ru, and Ti have been exemplified as the cap 312 materials, other materials are contemplated, and the embodiments discussed herein are not limited to Ta, Ru, or Ti for the cap 312.

The DFL sensor 300 further includes a first synthetic antiferromagnetic (SAF) soft bias (SB) (e.g., a side shield) that includes a first lower SB 316a, a first spacer 318a, and a first upper SB 320a and a second SAF SB that includes a second lower SB 316b, a second spacer 318b, and a second upper SB 320b.

The first lower SB 316a and the second lower SB 316b includes a material selected from the group that includes NiFe, CoFe, CoNi, CoFeNi, CoFeB, Co, and alloys thereof. The first lower SB 316a and the second lower SB 316b may be formed by well-known deposition methods such as sputtering. The first lower SB 316a and the second lower SB 316b may each have a thickness of between about 15 Angstroms to about 340 Angstroms. Additionally, it is to be understood that while NiFe, CoFe, CoNi, CoFeNi, CoFeB, and Co have been exemplified as the cap 312 materials, other materials are contemplated, and the embodiments discussed herein are not limited to Ta, Ru, or Ti for the cap 312.

The first spacer 318a is formed on the first lower SB 316a, and the second spacer 318b is formed on the second lower SB 316b. A suitable material for the first spacer 318a and the second spacer 318b includes ruthenium (Ru) at a thickness of between about 4 Angstroms to about 10 Angstroms. It is to be understood that while Ru has been exemplified as the first spacer 318a and the second spacer 318b material, other materials are contemplated, and the embodiments discussed herein are not limited to Ru for the first spacer 318a and the second spacer 318b.

The first upper SB 320a and the second upper SB 320b includes a material selected from the group that includes NiFe, CoFe, CoNi, CoFeNi, CoFeB, Co, and alloys thereof. The first upper SB 320a and the second upper SB 320b may be formed by well-known deposition methods such as sputtering. The first upper SB 320a and the second upper SB 320b may each have a thickness of between about 15 Angstroms to about 340 Angstroms. Additionally, it is to be understood that while NiFe, CoFe, CoNi, CoFeNi, CoFeB, and Co have been exemplified as the first upper SB 320a and the second upper SB 320b materials, other materials are contemplated, and the embodiments discussed herein are not limited to NiFe, CoFe, CoNi, CoFeNi, CoFeB, and Co for the first upper SB 320a and the second upper SB 320b. In various embodiments, a capping layer, similar to the cap 312, may be formed on both the first upper SB 320a and the second upper SB 320b. The capping layer may have a thickness of between about 10 Angstroms to about 100 Angstroms.

The insulation material 324 may be placed in the DFL sensor 300, such that electrical shorting between the S1 302, the seed layer 304, the first FL 306, the barrier layer 308, the second FL 310, the cap 312, the S2 322, the first SAF SB, and the second SAF SB may be avoided. Suitable materials for the insulating layer 324 include dielectric materials such as aluminum oxide, silicon oxide, and silicon nitride. The insulating layer 324 may be formed by well-known deposition methods such as atomic layer deposition (ALD) or sputtering. The insulating layer 324 may have a thickness of between about 10 Angstroms to about 700 Angstroms.

In one embodiment, the first lower SB 316a and the second lower SB 318b are identical. Furthermore, the first upper SB 320a and the second upper SB 320b are identical. Also, the first spacer 318a and the second spacer 318b are identical.

Figure 4A:
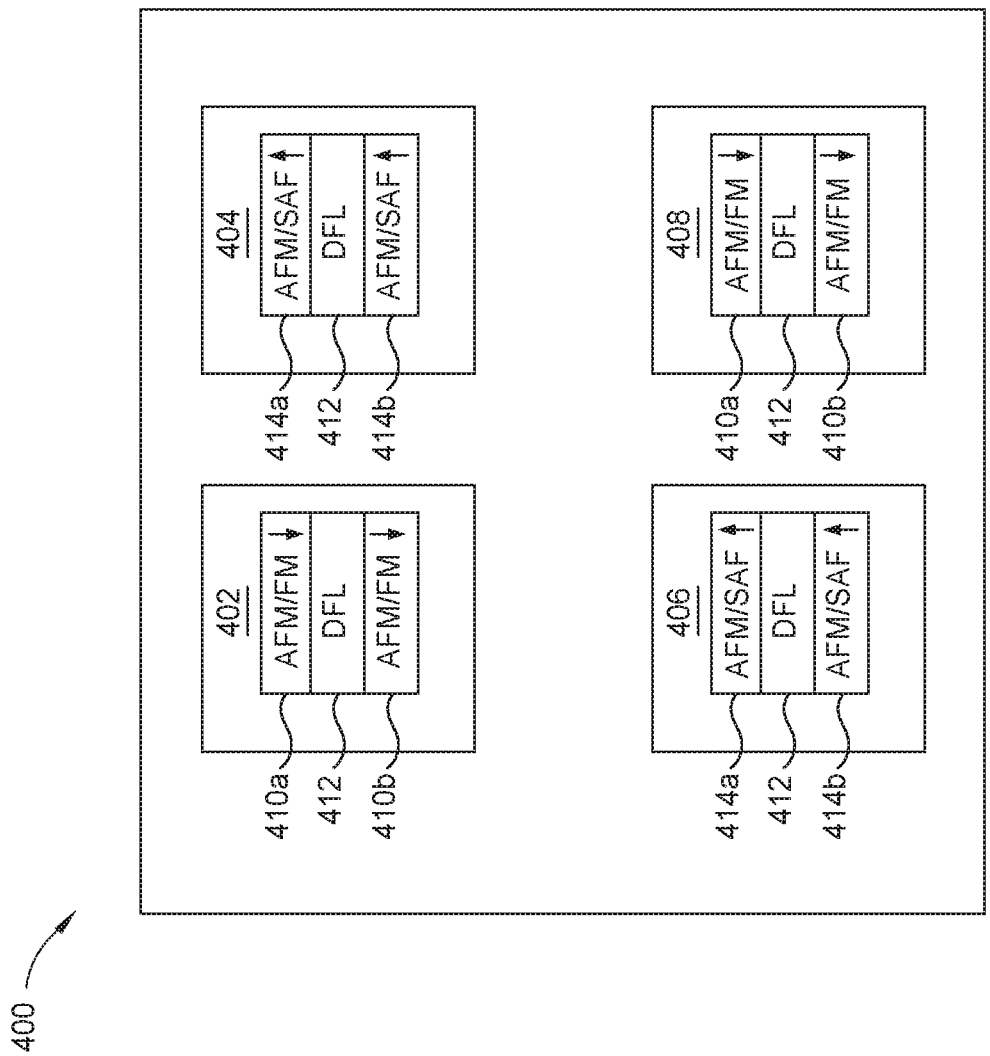

FIG. 4A is a schematic top view illustration of a sensor device 400 according to one embodiment. Aspects of the Wheatstone bridge array 200 of FIG. 2 may be similar to the embodiments described in FIG. 4A. For example, the first resistor 402 may correspond to R4, the second resistor 404 may correspond to R1, the third resistor 406 may correspond to R3, and the fourth resistor 408 may correspond to R2. Additionally, the first resistor 402 and the fourth resistor 408 are distinct from the second resistor 404 and the third resistor 406 based upon the DFL sensors with different adjacent magnetic structures that provide two different magnetoresistances responses.

The first resistor 402 and the fourth resistor 408 each includes antiferromagnetic/ferromagnetic (AFM/FM) structures 410a, 410b, and a DFL sensor 412. As will be discussed below, the DFL sensor 412 is disposed adjacent the AFM/FM structures 410a, 410b. The DFL sensor 412 may be the DFL sensor 300 described in FIG. 3. The AFM/FM structures 410a, 410b are multilayer structures, where the base layer is an AFM layer, and the FM portion is a ferromagnetic structure formed on the AFM layer. The pinning direction of the FM layer is set by cooling down from blocking temperature of AFM to room temperature in a global magnetic field pointing downwards. Because of the exchange bias between AFM and FM layers, the FM layer is aligned about the same direction as the magnetic field during the annealing process. The direction of the magnetic field of the AFM/FM structures 410a, 410b is illustrated by the arrows of the AFM/FM structures 410a, 410b.

The AFM layer of the AFM/FM structures 410a, 410b may include IrMn, FeMn, NiMn, PdMn, or PtMn at a thickness of between about 40 Angstroms to about 500 Angstroms. The AFM layer may be formed by well-known deposition methods such as sputtering. Additionally, it is to be understood that while IrMn, FeMn, NiMn, PdMn, and PtMn have been exemplified as the AFM layer materials, other materials are contemplated, and the embodiments discussed herein are not limited to IrMn, FeMn, PdMn, NiMn, or PtMn for the AFM layer.

The FM layer of the AFM/FM structures 410a, 410b may include CoFe, NiFe, CoFeNi, CoMnGe, NiCo, NiFeCu, CoFeMnGe, CoMnSi, CoFeSi, other soft or hard ferromagnetic materials, or other Heusler alloys at a thickness equal or larger than the thickness of DFL sensor, and the typical thickness is between about 100 Angstroms to about 1000 Angstroms. The FM layer may be formed by well-known deposition methods such as sputtering. Additionally, it is to be understood that while CoFe, NiFe, CoFeNi, CoMnGe, NiCo, NiFeCu, CoFeMnGe, CoMnSi, CoFeSi, and Heusler alloys have been exemplified as the FM layer materials, other materials are contemplated, and the embodiments discussed herein are not limited to CoFe, NiFe, CoFeNi, CoMnGe, NiCo, NiFeCu, CoFeMnGe, CoMnSi, CoFeSi, or Heusler alloys for the FM layer. Suitable materials for the spacer layer will be discussed below.

The second resistor 404 and the third resistor 406 each includes AFM/SAF structures 414a, 414b, and a DFL sensor 412. The DFL sensor 412 is disposed adjacent to the AFM/SAF structures 414a, 414b. The DFL sensor 412 may be the DFL sensor 300 described in FIG. 3.

FIGS. 4B and 4C are schematic cross-sectional illustrations of resistor elements 420, 430 of the TMR sensor device 400 according to various embodiments. The resistor elements 420, 430 may be any of resistors 402, 404, 406, 408. Two of the resistors, 402, 408 have identical resistor elements 420 while the remaining two resistors 404, 406 have identical resistor elements 430. FIG. 4B illustrates resistor element 420. Resistor element 420 includes a magnetic structure 414 adjacent a DFL sensor 412. The magnetic structure 414 includes an AFM layer 422 with a synthetic antiferromagnetic (SAF) structure 421 thereover. The SAF structure 421 includes a first ferromagnetic (FM1) layer 424 disposed on or over the AFM layer 422, a spacer layer 426 disposed on or over the FM1 layer 424, and a second ferromagnetic (FM2) layer 428 disposed on the spacer layer 426. The spacer layer 426 is a metal layer with particular thickness such that FM1 layer 424 and FM2 layer 428 are anti-ferromagnetically coupled with each other. In one embodiment, the DFL 412 is linearly aligned to the FM2 layer 428 when viewed in cross-section, as shown in FIG. 4B. FIG. 4C illustrates resistor element 430. Resistor element 430 includes the DFL sensor 412 adjacent to a magnetic structure 432. The magnetic structure 432 includes an AFM layer 422 having a ferromagnetic (FM) layer 434 thereon. The DFL sensor 412 is linearly aligned with the FM layer 434 when viewed in cross-section. The pinning direction of the FM2 layer 428 is set by the same cooling process in magnetic structures 414, 432. Because of the exchange bias between the AFM layer 422 and FM1 layer 424, and exchange bias between the AFM layer 422 and FM layer 434, FM1 layer 424 and FM layer 434 are aligned about the same direction as the magnetic field during the annealing process, and FM2 layer 428 is aligned in the opposite direction as the magnetic field, or in the opposite direction as the FM layer 434 in resistor element 430. The direction of the magnetic field of the magnetic structures 414, 432 is illustrated by the arrows of the AFM/FM structures 410a, 410b.

The different magnetic structures 414, 432 for the resistor elements 420, 430 in different resistors 402, 404, 406, 408 is what causes the various resistors 402, 404, 406, 408 to be different. For example, resistors 402, 408 may comprise one or more resistor elements 420 while resistors 404, 406 comprise one or more resistor elements 430. Alternatively, resistors 402, 408 may comprise one or more resistor elements 430 while resistors 404, 406 comprise one or more resistor elements 420. By utilizing the same DFL sensor 412 for the resistor elements 420, 430, but utilizing a different magnetic structure adjacent thereto, fabrication of the resistors is simplified.

The AFM layer 422 may include IrMn, FeMn, NiMn, PdMn, or PtMn at a thickness of between about 40 Angstroms to about 500 Angstroms. The AFM layer may be formed by well-known deposition methods such as sputtering. Additionally, it is to be understood that while IrMn, FeMn, NiMn, PdMn, and PtMn have been exemplified as the AFM layer materials, other materials are contemplated, and the embodiments discussed herein are not limited to IrMn, FeMn, PdMn, NiMn, or PtMn for the AFM layer.

The SAF structure 421 includes an FM1 layer 424, a spacer layer 426, and an FM2 layer 428. The FM1 layer 424, the FM2 layer 428, and the FM layer 434 may include CoFe, NiFe, CoFeNi, CoMnGe, NiCo, NiFeCu, CoFeMnGe, CoMnSi, CoFeSi, other soft or hard ferromagnetic materials, or other Heusler alloys at a thickness equal or larger than the thickness of DFL sensor, and the typical thickness is between about 100 Angstroms to about 1000 Angstroms as the magnetic layers with a spacer layer therebetween. FM1 layer 424 and FM2 layer 428 may be formed by well-known deposition methods such as sputtering. Additionally, it is to be understood that while CoFe, NiFe, CoFeNi, CoMnGe, NiCo, NiFeCu, CoFeMnGe, CoMnSi, CoFeSi, and Heusler alloys have been exemplified as the FM layer materials, other materials are contemplated, and the embodiments discussed herein are not limited to CoFe, NiFe, CoFeNi, CoMnGe, NiCo, NiFeCu, CoFeMnGe, CoMnSi, CoFeSi, or Heusler alloys for the FM1 layer 424 and FM2 layer 426.

A suitable material for the spacer layer 426 includes ruthenium (Ru) at a thickness of between about 4-5 Angstroms or 8-9 Angstroms. It is to be understood that while Ru has been exemplified as the spacer layer 426 material, other materials are contemplated, and the embodiments discussed herein are not limited to Ru for the spacer layer 426. The magnetization direction of the FM1 layer 424 is opposite of the magnetization direction of the FM2 layer 428 due to the antiparallel coupling to the spacer layer 426.

FIGS. 4D-4F are schematic illustrations of resistors 440, 450, 460 of a DFL sensor device 400 according to one embodiment. The resistors 440, 450, 460 may be any of the resistors 402, 404, 406, 408 of FIG. 4A. The AFM stacks (which may be referred to as a magnetic structure or MS) 442a-442c, 452a-452i, 462a-462f may be either the AFM/FM structures 410a, 410b or the AFM/SAF structures 414.

The DFLs 444a-444f, 454a-454f, 464a-464f may be the DFL sensor 300 of FIG. 3. The number of rows and the number of columns of the AFM stacks illustrated in FIGS. 4D-4F are not intended to be limiting, but to provide an example of a possible embodiment. Likewise, the number of rows and the number of columns of the DFLs illustrated in FIGS. 4D-4F are not intended to be limiting, but to provide an example of a possible embodiment.

In FIG. 4D, the resistor 440 includes a first magnetic structure 442a, a plurality of DFL sensors 444a-444c, a second magnetic structure 442b, a plurality DFL sensors 444d-444f, and a third magnetic structures 442c. In one embodiment, the magnetic structures 442a-442c have the same size as three of the DFL sensors 444a-444c combined.

The plurality of DFL sensors 444a-444f is connected in series, where the top leads of one sensor are connected to the bottom leads of the adjacent sensor. For example, the top lead of a first DFL sensor 444a is connected to the bottom lead of the second DFL sensor 444b, the top lead of the second DFL 444b is connected to the bottom lead of the third DFL sensor 444c, and so forth.

Because the plurality of DFL sensors 444a-444f is connected in series, a single shared biasing unit may be used to bias all the DFL sensors concurrently. The biasing unit of FIG. 4D may be any of the magnetic structures 442a-442c. For example, the first magnetic structure 442a and second magnetic structure 442b may act upon the first, second, and third DFL sensors 444a-444c, where the direction of the magnetic field of the first magnetic structure 442a is imposed on the first, second, and third DFL sensors 444a-444c. Because of the same global magnetic field, the fourth, fifth, sixth DFL sensors 444d-444f are biased in the same direction as the first, second, and third DFL sensors 444a-444c by magnetic structures 442b, 442c.

In FIG. 4E, the resistor 450 includes a plurality of magnetic structures 452a-452c, a plurality of DFL sensors 454a-454c, a plurality of magnetic structures 452d-452f, a plurality of DFL sensors 454d-454f, and a plurality of magnetic structures 452g-452i. In one embodiment, the magnetic structure has the same size as each of the DFL sensors.

The plurality of DFL sensors 454a-454f is connected in series, where the top leads of one sensor are connected to the bottom leads of the adjacent sensor. For example, the top lead of a first DFL sensor 454a is connected to the bottom lead of the second DFL sensor 454b, the top lead of the second DFL 454b is connected to the bottom lead of the third DFL sensor 454c, and so forth.

Each individual of DFL sensors 454a-454f is biased separately by each pair of magnetic structures 452a-452i on top and below it. For example, the first DFL sensor 454a may be acted upon by magnetic structure 452a above and magnetic structure 452d below where the direction of the magnetic field of the first magnetic structure 452a is imposed on the first DFL sensor 454a, and direction of the magnetic field of the magnetic structure 452d is imposed on the first DFL sensor 454a. Because of the same global magnetic field, the second through sixth DFL sensors 454d-454f are biased in the same direction as the first DFL sensor 454a.

In FIG. 4F, the resistor 460 includes a plurality of magnetic structures 462a-462c, a plurality of DFL sensors 464a-464c, a fourth magnetic structure 462d, a plurality of DFL sensors 464d-464f, and a plurality of magnetic structure 462g-462f. In one embodiment, the magnetic structure has the same size as one of the DFL sensors, two of the DFL sensors, and/or three of the DFL sensors. The previously listed sizes are not intended to be limiting, but to provide an example of a possible embodiment. For example, a first magnetic structure 462a has the same size as a first DFL sensor 464a, a fourth magnetic structure 462d has the same size as the first, second, and third DFL sensors 464a, 464b, 464c combined, and a sixth magnetic structure 462f has the same as the fourth and fifth DFL sensors 464d-464e combined.

The plurality of DFL sensors 464a-464f is connected in series, where the top leads of one sensor are connected to the bottom leads of the adjacent sensor. For example, the top lead of a first DFL sensor 464a is connected to the bottom lead of the second DFL sensor 464b, the top lead of the second DFL sensor 464b is connected to the bottom lead of the third DFL sensor 464c, and so forth.

Because the plurality of DFL sensors is connected in series, a single shared biasing unit may be used to bias all the DFL sensors concurrently. The biasing unit of FIG. 4F may be any of the magnetic structures 462a-462f. For example, the first magnetic structure 462a may act upon the first DFL sensor 454a, where the direction of the magnetic field of the first magnetic structure 462a is imposed on the first DFL sensor 464a. Because of the same global magnetic field, the second through sixth DFL sensors 464d-464f are biased in the same direction as the first DFL sensor 464a.

Figure 5A:
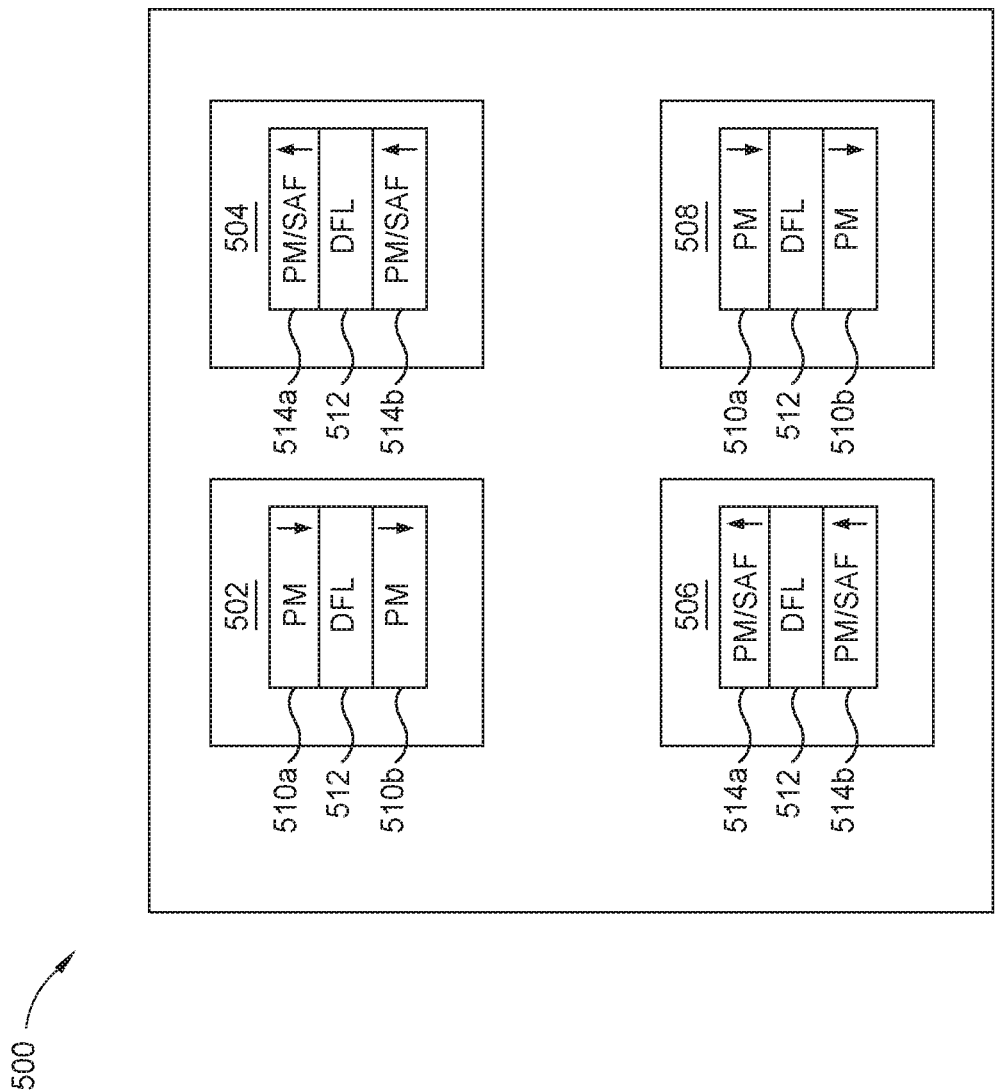

FIG. 5A is a schematic top view illustration of a sensor device 500 according to another embodiment. Aspects of the Wheatstone bridge array 200 of FIG. 2 may be similar to the embodiments described in FIG. 5A. For example, the first resistor 502 may correspond to R4, the second resistor 504 may correspond to R1, the third resistor 506 may correspond to R3, and the fourth resistor 508 may correspond to R2. Additionally, the first resistor 502 and the fourth resistor 508 are distinct from the second resistor 504 and the third resistor 506 based upon the DFL sensors adjacent different magnetic structures to provide two different magnetoresistances responses.

The first resistor 502 and the fourth resistor 508 each includes permanent magnet 510a, 510b, and a DFL sensor 512. The DFL sensor 512 is disposed adjacent the PM 510a, 510b. The DFL sensor 512 may be the DFL sensor 300 described in FIG. 3. The magnetic field of the PM 510a, 510b are set by an about a global magnetic field larger than the coercivity of PM pointing downwards. The direction of the magnetic field of the PM 510a, 510b are illustrated by the arrows of the PM 510a, 510b.

The second resistor 504 and the third resistor 506 each includes a PM/SAF structure 514 and a DFL sensor 512. The DFL sensor 512 is disposed adjacent the PM/SAF structure 514. The DFL sensor 512 may be the DFL sensor 300 described in FIG. 3.

FIGS. 5B and 5C are schematic illustrations of resistor elements 520, 530 of the resistors 502, 504, 506, 508 of the sensor device 500 according to various embodiments. The resistor element 520 includes a PM/SAF structure 514 and a DFL 512. Resistor element 530 includes a PM 532 and the DFL sensor 512. The PM/SAF structure 514 includes a PM 522 having a SAF 521 thereover. The SAF 521 includes an FM1 layer 524 disposed on or over the PM 522, a spacer layer 526 disposed on or over the FM1 layer 524, and an FM2 layer 528 disposed on or over the spacer layer 526. In one embodiment, the DFL sensor 512 is aligned to the FM2 layer 528, as shown in FIG. 5B. The magnetic orientation of the FM2 layer is set by the same field set process as discussed above. Because of strong coupling between PM 522 and the FM1 layer 524, the FM1 layer 524 is aligned about the same direction as the magnetic field during field reset process, and the FM2 layer 528 is aligned in the opposite direction. The direction of the magnetic field of the FM2 layer 528 in the magnetic structure 514 is illustrated by the arrows of the PM/SAF structures 514a, 514b.

PM 522 is formed of a material having high coercivity, such as a material that includes one or more of Co, Pt and/or Cr, such as CoPt or CoPtCr. With a thickness of between about 100 Angstroms to about 1000 Angstroms. The PM 522 may be formed by well-known deposition methods such as physical vapor deposition (PVD) such as sputtering or IBD. Additionally, it is to be understood that while CoPt or CoPtCr has been exemplified as the PM material, other materials are contemplated, and the embodiments discussed herein are not limited to CoPt or CoPtCr for the PMs.

The SAF structure 521 includes the FM1 layer 524, the spacer layer 526, and the FM2 layer 528. The FM1 layer 524 and the FM2 layer 528 may include CoFe, NiFe, CoFeNi, CoMnGe, NiCo, NiFeCu, CoFeMnGe, CoMnSi, CoFeSi, other soft or hard ferromagnetic materials, or other Heusler alloys at a thickness of between about 100 Angstroms to about 1000 Angstroms. The FM layers may be formed by well-known deposition methods such as sputtering. Additionally, it is to be understood that while CoFe, NiFe, CoFeNi, CoMnGe, NiCo, NiFeCu, CoFeMnGe, CoMnSi, CoFeSi, and Heusler alloys have been exemplified as the FM layer materials, other materials are contemplated, and the embodiments discussed herein are not limited to CoFe, NiFe, CoFeNi, CoMnGe, NiCo, NiFeCu, CoFeMnGe, CoMnSi, CoFeSi, or Heusler alloys for the FM layer.

A suitable material for the spacer layer 526 includes ruthenium (Ru) at a thickness of between about 4-5 Angstroms or 8-9 Angstroms. It is to be understood that while Ru has been exemplified as the spacer layer 526 material, other materials are contemplated, and the embodiments discussed herein are not limited to Ru for the spacer layer 526. The magnetization direction of the FM1 layer 524 is opposite of the magnetization direction of the FM2 layer 528 due to the antiparallel coupling to the spacer layer 526. Furthermore, the biasing of the PM/SAF structure 514 to DFL sensor 512 may be due to the magnetic direction of the FM2 layer 528.

FIGS. 5D-5F are schematic illustrations of resistors 540, 550, 560 of a sensor device 500 according to one embodiment. The resistors 540, 550, 560 may be any of the resistors 502, 504, 506, 508 of FIG. 5A. The magnetic structures 542a-542c, 552a-552i, 562a-562f may be either the PMs 510a, 510b or the PM/SAF structure 514a, 514b. The DFL sensors 544a-544f, 554a-554f, 564a-564f may be the DFL sensor 300 of FIG. 3. The number of rows and the number of columns of the magnetic structures illustrated in FIGS. 5D-5F are not intended to be limiting, but to provide an example of a possible embodiment. Likewise, the number of rows and the number of columns of the DFL sensors illustrated in FIGS. 5D-5F are not intended to be limiting, but to provide an example of a possible embodiment.

In FIG. 5D, the resistor 540 includes a first magnetic structure 542a, a plurality of DFL sensors 544a-544c, a second magnetic structure 542b, a plurality DFL sensors 544d-544f, and a third magnetic structure 542c. In one embodiment, the magnetic structure has the same size as three of the DFL sensors.

The plurality of DFL sensors 544a-544f is connected in series, where the top leads of one sensor are connected to the bottom leads of the adjacent sensor. For example, the top lead of a first DFL sensor 544a is connected to the bottom lead of the second DFL sensor 544b, the top lead of the second DFL sensor 544b is connected to the bottom lead of the third DFL sensor 544c, and so forth.

Because the plurality of DFL sensors is connected in series, a single shared biasing unit may be used to bias all the DFL sensors concurrently. The biasing unit of FIG. 5D may be any of the magnetic structures 542a-542c. For example, the first magnetic structure 542a and second magnetic structure 542b may act upon the first, second, and third DFL sensors 544a-544c, where the directions of the magnetic field of the first magnetic structure 542a and second magnetic structure are imposed on the first, second, and third DFL sensors 544a-544c. Because of the global field during the PM reset process, the fourth, fifth, sixth DFL sensors 544d-544f are biased in the same direction as the first, second, and third DFL sensors 544a-544c.

In FIG. 5E, the resistor 550 includes a plurality of magnetic structures 552a-552c, a plurality of DFL sensors 554a-554c, a plurality of magnetic structures 552d-552f, a plurality of DFL sensors 554d-554f, and a plurality of magnetic structures 552g-552i.

The plurality of DFL sensors 554a-554f is connected in series, where the top leads of one sensor are connected to the bottom leads of the adjacent sensor. For example, the top lead of a first DFL sensor 554a is connected to the bottom lead of the second DFL sensor 554b, the top lead of the second DFL sensor 554b is connected to the bottom lead of the third DFL sensor 554c, and so forth.

Each individual of DFL sensors 554a-554f is biased separately by each pair of magnetic structures 552a-552i on top and below it. The biasing unit of FIG. 5E may be any of the magnetic structures 552a-552i. For example, the first magnetic structure 552a may act upon the first DFL sensor 554a, where the direction of the magnetic field of the first magnetic structure 552a is imposed on the first DFL sensor 554a. Because of the global field during the PM reset process, the second through sixth DFL sensors 554d-554f are biased in the same direction as the first DFL sensor 554a.

In FIG. 5F, the resistor 560 includes a plurality of magnetic structures 562a-562c, a plurality of DFL sensors 564a-564c, a fourth magnetic structure 562d, a plurality of DFL sensors 564d-564f, and a plurality of magnetic structures 562g-562f. In one embodiment, the magnetic structures have the same size as one of the DFL sensors, two of the DFL sensors, and/or three of the DFL sensors. The previously listed sizes are not intended to be limiting, but to provide an example of a possible embodiment. For example, a first magnetic structure 562a has the same size as a first DFL sensor 564a, a fourth magnetic structure 562d has the same size as the first, second, and third DFL sensors 564a, 564b, 564c combined, and a sixth magnetic structure 562f has the same as the fourth and fifth DFL sensors 564d-564e combined.

The plurality of DFL sensors 564a-564f is connected in series, where the top leads of one sensor are connected to the bottom leads of the adjacent sensor. For example, the top lead of a first DFL sensor 564a is connected to the bottom lead of the second DFL sensor 564b, the top lead of the second DFL sensor 564b is connected to the bottom lead of the third DFL sensor 564c, and so forth.

Because of the global field during the PM reset process, a single shared biasing unit may be used to bias all the DFL sensors concurrently. The biasing unit of FIG. 5F may be any of the magnetic structures 562a-562f. For example, the first magnetic structure 562a may act upon the first DFL sensor 554a, where the direction of the magnetic field of the first magnetic structure 562a is imposed on the first DFL sensor 564a. Because of the global field during the PM reset process, the second through sixth DFL sensors 564d-564f are biased in the same direction as the first DFL sensor 564a.

Figure 6A:
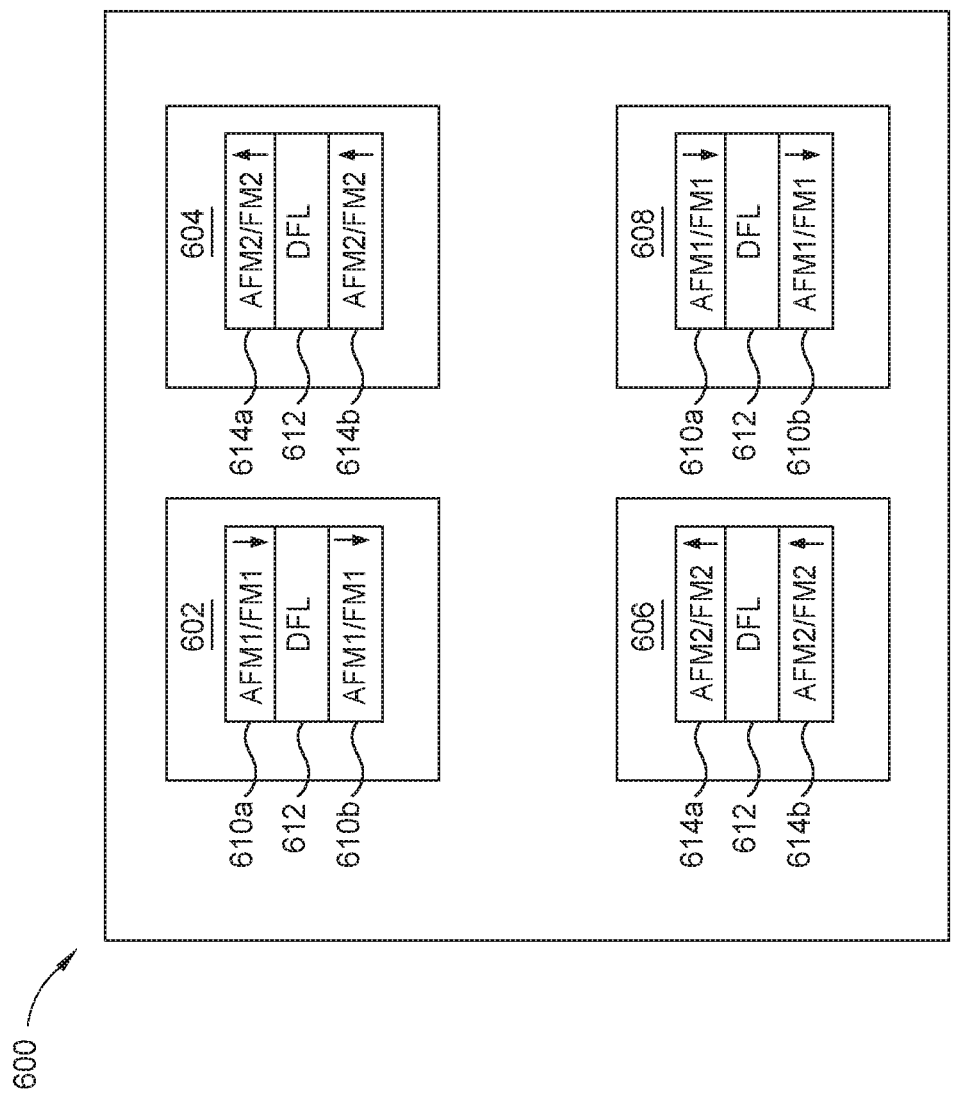

FIG. 6A is a schematic illustration of a sensor device 600 according to another embodiment. Aspects of the Wheatstone bridge array 200 of FIG. 2 may be similar to the embodiments described in FIG. 6A. For example, the first resistor 602 may correspond to R4, the second resistor 604 may correspond to R1, the third resistor 606 may correspond to R3, and the fourth resistor 608 may correspond to R2. Additionally, the first resistor 602 and the fourth resistor 608 are distinct from the second resistor 604 and the third resistor 606 based upon the TMR structures to provide two different magnetoresistances responses.

The first resistor 602 and the fourth resistor 608 each includes a first AFM1/FM1 structure 610a, a DFL sensor 612, and a second AFM1/FM1 structure 610b. The DFL sensor 612 is disposed between the first AFM1/FM1 structure 610a and the second AFM2/FM2 structure 610b. The DFL sensor 612 may be the DFL sensor 300 described in FIG. 3. The magnetic field of the AFM1/FM1 structures 610a, 610b are set about a global magnetic field pointing downwards. The direction of the magnetic field of the AFM1/FM1 structures 610a, 610b are illustrated by the arrows of the AFM1/FM1 structures 610a, 610b.

The second resistor 604 and the third resistor 606 each includes a first AFM2/FM2 structure 614a, a DFL sensor 612, and a second AFM2/FM2 structure 614b. The DFL sensor 612 is disposed between the first AFM2/FM2 structure 614a and the second AFM2/FM2 structure 614b. The DFL sensor 612 may be the DFL sensor 300 described in FIG. 3. The direction of the magnetic field of the AFM2/FM2 structures 614a, 614b are illustrated by the arrows of the AFM2/FM2 structures 614a, 614b.

FIGS. 6B and 6C are schematic illustrations of the resistor elements 620, 630 for resistors 602, 604, 606, 608 of the TMR sensor device 600 according to various embodiments. The resistor element 620 may be used in the first resistor 602 and/or the fourth resistor 608. The resistor element 620 includes a first AFM1/FM1 structure 610a, a second AFM1/FM1 structure 610b, and a DFL sensor 612. The AFM1/FM1 structures 610a, 610b each includes an AFM1 layer 622, an FM1 layer 624 disposed on the AFM1 layer 622.

The resistor element 630 may be used as the second resistor 604 and/or the third resistor 606. The resistor element 630 includes a first AFM2/FM2 structure 614a, a second AFM2/FM2 structure 614b, and a DFL sensor 612. The AFM2/FM2 structures 614a, 614b each includes an AFM2 layer 632, an FM2 layer 634 disposed on the AFM2 layer 632.

In regards to resistor element 620, in one embodiment, the DFL sensor 612 is aligned to the FM1 layer 624. In regards to resistor element 630, in one embodiment, the DFL sensor 612 is aligned to the FM2 layer 634, as shown in FIG. 6C.

The AFM1 layer 622 and the AFM2 layer 632 may include IrMn, FeMn, NiMn, PdMn, or PtMn at a thickness of between about 40 Angstroms to about 500 Angstroms. The AFM layers 622, 632 may be formed by well-known deposition methods such as sputtering. Additionally, it is to be understood that while IrMn, FeMn, NiMn, PdMn, and PtMn have been exemplified as the AFM layer materials, other materials are contemplated, and the embodiments discussed herein are not limited to IrMn, FeMn, PdMn, NiMn, or PtMn for the AFM layer. In one embodiment, the AFM1 layer 622, 610a, 610b is different than the AFM2 layer 632, 614a, 614b, such that the AFM1 layer 622 and AFM2 layer 632 have different blocking temperatures. Furthermore, the AFM1 layer 622 is set by cooling in a first magnetic field to the first bias direction from a first blocking temperature. The AFM2 layer 632 is set by cooling in a second magnetic field to the second bias direction from a second blocking temperature, where the second blocking temperature is less than the first blocking temperature, and the second magnetic field direction is opposite of the first magnetic field direction, and second bias direction is opposite of the first bias direction. The magnetic field direction from the FM1 layer 624 is the opposite of the magnetic field direction from the FM2 layer 634.

The FM1 layer 624 and the FM2 layer 634 from FIGS. 6B and 6C may include CoFe, NiFe, CoFeNi, CoMnGe, NiCo, NiFeCu, CoFeMnGe, CoMnSi, CoFeSi, other soft or hard ferromagnetic materials, or other Heusler alloys at a thickness of between about 100 Angstroms to about 1000 Angstroms. The FM layers may be formed by well-known deposition methods such as sputtering. Additionally, it is to be understood that while CoFe, NiFe, CoFeNi, CoMnGe, NiCo, NiFeCu, CoFeMnGe, CoMnSi, CoFeSi, and Heusler alloys have been exemplified as the FM layer materials, other materials are contemplated, and the embodiments discussed herein are not limited to CoFe, NiFe, CoFeNi, CoMnGe, NiCo, NiFeCu, CoFeMnGe, CoMnSi, CoFeSi, or Heusler alloys for the FM layer. In an embodiment, the FM1 layer 624 includes the same materials as the FM2 layer 634. In another embodiment, the FM1 layer 624 does not include the same materials as the FM2 layer 634. The magnetization direction of the FM1 layer 624 is opposite of the magnetization direction of the FM2 layer 634 in FIG. 6C due to the opposite field direction during the field cooling process.

FIGS. 6D-6F are schematic illustrations of resistors 640, 650, 660 of a TMR sensor device 600 according to one embodiment. The resistors 640, 650, 660 may be any of the resistors 602, 604, 606, 608 of FIG. 6A. The AFM1/2 stacks 642a-642c, 652a-652i, 662a-562f may be either the AFM1/FM1 layers 610a, 610b or the AFM2/FM2 structures 614a, 614b. The DFL sensors 644a-644f, 654a-654f, 664a-664f may be the DFL sensor 300 of FIG. 3. The number of rows and the number of columns of the AFM stacks illustrated in FIGS. 6D-6F are not intended to be limiting, but to provide an example of a possible embodiment. Likewise, the number of rows and the number of columns of the DFL sensors illustrated in FIGS. 6D-6F are not intended to be limiting, but to provide an example of a possible embodiment.

In FIG. 6D, the resistor 640 includes a first AFM1/2 stack 642a, a plurality of DFL sensors 644a-644c, a second AFM1/2 stack 642b, a plurality DFL sensors 644d-644f, and a third AFM1/2 stack 642c. In one embodiment, the AFM1/2 stack has the same size as three of the DFL sensors. The previously listed size is not intended to be limiting, but to provide an example of a possible embodiment. For example, the first AFM1/2 stack 642a has the same size as the first, second, and third DFL sensor 644a-644c combined.

The plurality of DFL sensors 644a-644f is connected in series, where the top leads of one sensor are connected to the bottom leads of the adjacent sensor. For example, the top lead of a first DFL sensor 644a is connected to the bottom lead of the second DFL sensor 644b, the top lead of the second DFL 644b is connected to the bottom lead of the third DFL sensor 644c, and so forth.

Because of the global field during field cooling process, a single shared biasing unit may be used to bias all the DFL cells concurrently. The biasing unit of FIG. 6D may be any of the AFM1/2 stacks 642a-642c. For example, the first AFM1/2 stack 642a and 642b may act upon the first, second, and third DFL sensors 644a-644c, where the direction of the magnetic field of the first AFM1/2 stack 642a and 642b is imposed on the first, second, and third DFL sensors 644a-644c. Because the DFL sensors are connected in series, the fourth, fifth, sixth DFL sensors 644d-644f are biased in the same direction as the first, second, and third DFL sensors 644a-644c.

In FIG. 6E, the resistor 650 includes a plurality of AFM1/2 stacks 652a-652c, a plurality of DFL sensors 654a-654c, a plurality of AFM1/2 stacks 652d-652f, a plurality of DFL sensors 654d-654f, and a plurality of AFM1/2 stacks 652g-652i. In one embodiment, the AFM1/2 stack has the same size as each of the DFL sensors. The previously listed size is not intended to be limiting, but to provide an example of a possible embodiment. For example, the first AFM1/2 stack 652a is the same size as each of the plurality of DFL sensors 654a-654f.

The plurality of DFL sensors 654a-654f is connected in series, where the top leads of one sensor are connected to the bottom leads of the adjacent sensor. For example, the top lead of a first DFL sensor 654a is connected to the bottom lead of the second DFL sensor 654b, the top lead of the second DFL sensor 654b is connected to the bottom lead of the third DFL sensor 654c, and so forth.

Each individual of DFL sensors 654a-654f is biased separately by each pair of AFM1/2 stacks 652a-652i on top and below it. For example, the first DFL sensor 654a may be acted upon by AFM1/2 stack 652a above and AFM1/2 stack 652d below it where the direction of the magnetic field of the first AFM1/2 stack 652a and 652d is imposed on the first DFL sensor 654a. Because of the same global magnetic field, the second through sixth DFL sensors 654d-654f are biased in the same direction as the first DFL sensor 654a.

In FIG. 6F, the resistor 660 includes a plurality of AFM1/2 stacks 662a-662c, a plurality of DFL sensors 664a-664c, a fourth AFM1/2 stack 662d, a plurality of DFL sensors 664d-664f, and a plurality of AFM1/2 stacks 662g-662f. In one embodiment, the AFM1/2 stack has the same size as one of the DFL sensors, two of the DFL sensors, and/or three of the DFL sensors. The previously listed sizes are not intended to be limiting, but to provide an example of a possible embodiment. For example, a first AFM1/2 stack 662a has the same size as a first DFL sensor 664a, a fourth AFM1/2 stack 662d has the same size as the first, second, and third DFL sensors 664a, 664b, 664c combined, and a sixth AFM1/2 stack 662f has the same as the fourth and fifth DFL sensors 664d-664e combined.

The plurality of DFL sensors 664a-664f is connected in series, where the top leads of one sensor are connected to the bottom leads of the adjacent sensor. For example, the top lead of a first DFL sensor 664a is connected to the bottom lead of the second DFL sensor 664b, the top lead of the second DFL sensor 664b is connected to the bottom lead of the third DFL sensor 664c, and so forth.

Because of the global field during field cooling process, a single shared biasing unit may be used to bias all the DFL sensors concurrently. The biasing unit of FIG. 6F may be any of the AFM1/2 stacks 662a-662f. For example, the first AFM1/2 stack 662a may act upon the first DFL sensor 654a, where the direction of the magnetic field of the first AFM1/2 stack 662a is imposed on the first DFL sensor 664a. Because the DFL sensors are connected in series, the second through sixth DFL sensors 664d-664f are biased in the same direction as the first DFL sensor 664a.

Figure 7:
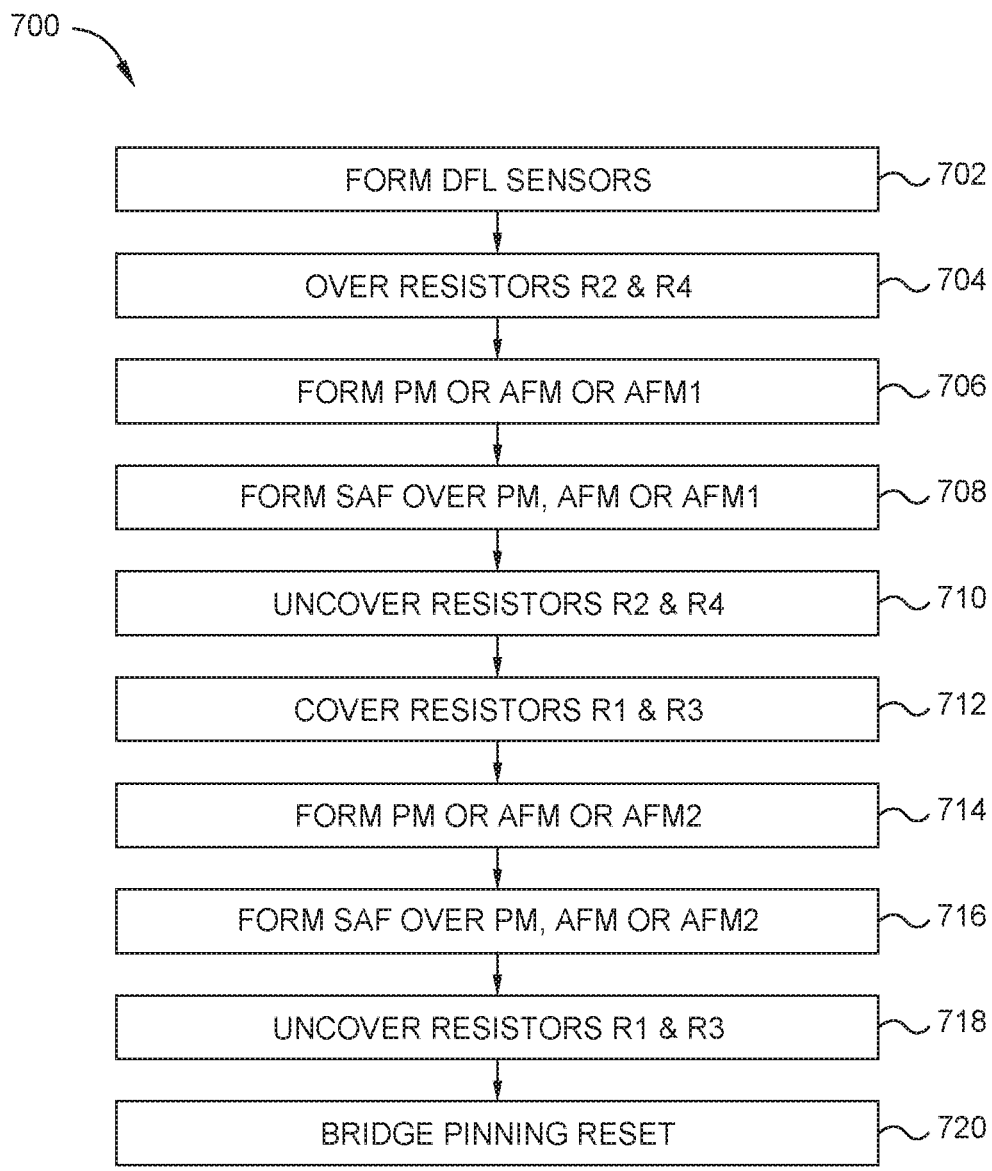
FIG. 7 is a flowchart illustrating a method of manufacturing a sensor device according to one embodiment.

FIG. 7 is a flowchart illustrating a method 700 of manufacturing a TMR sensor device according to one embodiment. It starts with a Si wafer. At block 702, the DFL sensors are formed and insulated with a material such as $Al_2O_3$, $Si_3N_4$, MgO, or their combination. The DFL sensors are formed for each of the resistors of the TMR sensor device. At block 704, resistors R2 and R4 are covered or masked so that processing can continue for resistors R1 and R3. More specifically, resistors R2 and R4 are covered with a hard mask material, such as DLC. Thereafter, a photoresist, such as duramide, is deposited over the resistors R1-R4. The photoresist is then patterned to expose the desired areas of resistors R1 and R3 for processing. The exposed desired areas of resistors R1 and R3 are then etched to remove materials using a removal process such as RIE. At block 706, either the PM, the AFM, or the AFM1 is formed adjacent to the DFL structure of resistors R1 and R3. At block 708, the SAF is deposited on the PM, the AFM, or FM1 is deposited on the AFM1 (rather than SAF on AFM1). After SAF deposition, a hard mask material, such as DLC is deposited followed by a CMP lift-off process and an RIE process.

At block 710, resistors R2 and R4 are uncovered and removed. The resistors R1 and R3 are then covered or masked so that processing can continue for resistors R2 and R4. The covering and masking comprises covering resistors R1 and R3 with a hard mask material, such as DLC. Thereafter, a photoresist, such as duramide, is deposited over the resistors R1-R4. The photoresist is then patterned to expose the desired areas of resistors R2 and R4 for processing. The exposed desired areas of resistors R2 and R4 are then etched to remove materials using a removal process such as RIE. At block 714, the PM, the AFM, or the AFM2 is formed adjacent to the DFL structure. At block 716, the FM is formed over the AFM, or FM2 is deposited on the AFM2 (nothing is formed over the PM). After FM or FM2 deposition, a hard mask material, such as DLC is deposited followed by a CMP lift-off process and an RIE process. At block 718, the resistors R1 and R3 are uncovered, and further processing of the DFL TMR sensor device continues to finish top leads/contact steps for the bridge sensor. The last step before dicing and packaging will do the field reset process in block 720. For bridge with PM/FM and PM/SAF, a global uniform magnetic field larger than the coercivity of PM is applied to set PM direction. For bridge with AFM/FM and AFM/SAF, the whole wafer is cooling down in a global uniform magnetic field from the above-blocking temperature of AFM. For bridge with AFM1/FM1 and AFM2/FM2, a two-step field-cooling step is performed: the first wafer is set by cooling in a first magnetic field to the bias direction from a first blocking temperature of AFM1. Then the AFM2 layer is set by continuous cooling down from a second blocking temperature of AMF2 to room temperature but in a $2^{nd}$ magnetic field, where the second blocking temperature is less than the first blocking temperature and second magnetic field direction is opposite of the $1^{st}$ magnetic field direction.

By using the same DFL structure and PM or AFM structures, but aligning the different FM layers of the PM or AFM structures with the DFL structures, a TMR sensor bridge device can be fabricated with decreased production time, thus saving money and decreasing complexity. Furthermore, using the same DFL structure with different AFM materials in the AFM structures will also decrease production time and thus save money and decrease complexity.

In one embodiment, the TMR sensor is used in a camera operating as a single axis sensor. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compass, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, AMR and GMR sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

In one embodiment, a sensor device comprises: a first resistor comprising: at least one first dual free layer (DFL) sensor; and at least one first magnetic structure, wherein each first magnetic structure comprises: a first antiferromagnetic (AFM) layer; and a synthetic AFM (SAF) structure disposed over the first AFM layer, wherein the at least one first DFL sensor is linearly aligned with the SAF structure when viewed in cross-section; and a second resistor comprising: at least one second DFL sensor; and at least one second magnetic structure. The SAF structure comprises: a first ferromagnetic layer; a spacer layer disposed over the first ferromagnetic layer; and a second ferromagnetic layer disposed over the spacer layer. The at least one first DFL sensor is linearly aligned with the second ferromagnetic layer. The at least one second magnetic structure comprises: a second AFM layer; and a ferromagnetic layer disposed over the second AFM layer. The at least one second DFL sensor is linearly aligned with the ferromagnetic layer when viewed in cross-section. The at least one first DFL sensor comprises a plurality of first DFL sensors, wherein the at least one first magnetic structure comprises a plurality of first magnetic structures, and wherein a number of the plurality of first DFL sensors is greater than a number of the plurality of first magnetic structures. The at least one second DFL sensor comprises a plurality of second DFL sensors, wherein the at least one second magnetic structure comprises a plurality of second magnetic structures, and wherein a number of the plurality of second DFL sensors is greater than a number of the plurality of second magnetic structures. The sensor device further comprises a third resistor, wherein the third resistor is substantially identical to the first resistor; and a fourth resistor, wherein the fourth resistor is substantially identical to the second resistor. The sensor device is a Wheatstone bridge array.

In another embodiment, a sensor device comprises: a first resistor comprising: at least one first dual free layer (DFL) sensor; and at least one magnetic structure, wherein each magnetic structure comprises: a first permanent magnet; and a synthetic antiferromagnetic (SAF) structure disposed over the first permanent magnet, wherein the at least one first DFL sensor is linearly aligned with the SAF structure when viewed in cross-section; and a second resistor comprising: at least one second DFL sensor; and at least one second permanent magnet, wherein the at least one second DFL sensor is linearly aligned with the at least one second permanent magnet when viewed in cross-section. The at least one first DFL sensor is a plurality of first DFL sensors connected in series. The at least one second DFL sensor is a plurality of second DFL sensors connected in series. The SAF structure comprises: a first ferromagnetic layer; a spacer layer disposed over the first ferromagnetic layer; and a second ferromagnetic layer disposed over the spacer layer, wherein the at least one first DFL sensor is linearly aligned with the second ferromagnetic layer. The at least one magnetic structure comprises a plurality of magnetic structures, wherein the at least one second permanent magnet comprises a plurality of second permanent magnets, wherein a number of the plurality of magnetic structures is equal to a number of the plurality of second permanent magnets. The sensor device is a Wheatstone bridge array.

In another embodiment, a sensor device comprises: at least one first resistor comprising: at least one first dual free layer (DFL) sensor; and at least one first magnetic structure, wherein each first magnetic structure comprises: a first antiferromagnetic (AFM) layer comprising a first material; and a first ferromagnetic layer disposed over the first AFM layer; and at least one second resistor comprising: at least one second DFL sensor; and at least one second magnetic structure, wherein each second magnetic structure comprises: a second AFM layer comprising a second material, wherein the second material is different from the first material; and a second ferromagnetic layer disposed over the second AFM layer, wherein the second ferromagnetic layer is the same or different from the first ferromagnetic layer. The at least one first DFL sensor is linearly aligned with the first ferromagnetic layer when viewed in cross-section. The at least one second DFL sensor is linearly aligned with the second ferromagnetic layer when viewed in cross-section. The at least one first resistor comprises a plurality of first resistors and wherein the at least one second resistor comprises a plurality of second resistors. The sensor device is a Wheatstone bridge array.

In another embodiment, a method comprises: forming a plurality of dual free layer sensors for a plurality of resistors; covering at least one first resistor of the plurality of resistors, wherein at least one second resistor of the plurality of resistors remains uncovered; forming either a first permanent magnet or a first antiferromagnetic layer adjacent the dual free layer sensor of the at least one second resistor; uncovering the at least one first resistor; covering the at least one second resistor; forming either a second permanent magnet or a second antiferromagnetic layer adjacent the dual free layer sensor of the at least one first resistor; uncover the at least one second resistor; and perform bridge pinning reset. Both a first permanent magnet and a second permanent magnet are formed. The method further comprises forming a synthetic antiferromagnetic structure over the first permanent magnet. Both a first antiferromagnetic layer and a second antiferromagnetic layer are formed. The first antiferromagnetic layer and the second antiferromagnetic layer comprise different materials. The method further comprises forming a ferromagnetic layer over the first antiferromagnetic layer and the second antiferromagnetic layer. The first antiferromagnetic layer and the second antiferromagnetic layer comprise the same materials. The method further comprises forming a synthetic antiferromagnetic structure over the first antiferromagnetic layer. The method further comprises forming a ferromagnetic layer over the second antiferromagnetic layer.

While the foregoing is directed to embodiments of the present disclosure, other and further embodiments of the disclosure may be devised without departing from the basic scope thereof, and the scope thereof is determined by the claims that follow.

What is claimed is:
1. A sensor device, comprising:
 a first resistor comprising:
  at least one first dual free layer (DFL) sensor, each first DFL sensor comprising a first synthetic antiferro- magnetic (SAF) soft bias side shield, a second SAF soft bias side shield, and a first free layer and a second free layer disposed between the first and second SAF soft bias side shields, wherein the first SAF soft bias side shield comprises a first lower soft bias, a first spacer disposed on the first lower soft bias, and a first upper soft bias disposed on the first spacer, and wherein the second SAF soft bias side shield comprises a second lower soft bias, a second spacer disposed on the second lower soft bias, and a second upper soft bias disposed on the second spacer; and
   at least one first magnetic structure, wherein each first magnetic structure comprises:
      a first antiferromagnetic (AFM) layer; and
      SAF structure disposed over the first AFM layer, wherein the at least one first DFL sensor is linearly aligned with the SAF structure when viewed in cross-section; and
   a second resistor comprising:
      at least one second DFL sensor; and
      at least one second magnetic structure.

2. The sensor device of claim 1, wherein the SAF structure comprises:
   a first ferromagnetic layer;
   a spacer layer disposed over the first ferromagnetic layer; and
   a second ferromagnetic layer disposed over the spacer layer.

3. The sensor device of claim 2, wherein the at least one first DFL sensor is linearly aligned with the second ferromagnetic layer.

4. The sensor device of claim 1, wherein the at least one second magnetic structure comprises:
   a second AFM layer; and
   a ferromagnetic layer disposed over the second AFM layer.

5. The sensor device of claim 4, wherein the at least one second DFL sensor is linearly aligned with the ferromagnetic layer when viewed in cross-section.

6. The sensor device of claim 1, wherein the at least one first DFL sensor is a plurality of first DFL sensors, wherein the at least one first magnetic structure is a plurality of first magnetic structures, and wherein a number of the plurality of first DFL sensors is greater than a number of the plurality of first magnetic structures.

7. The sensor device of claim 6, wherein the at least one second DFL sensor is a plurality of second DFL sensors, wherein the at least one second magnetic structure is a plurality of second magnetic structures, and wherein a number of the plurality of second DFL sensors is greater than a number of the plurality of second magnetic structures.

8. The sensor device of claim 1, further comprising:
   a third resistor, wherein the third resistor is substantially identical to the first resistor; and
   a fourth resistor, wherein the fourth resistor is substantially identical to the second resistor.

9. The sensor device of claim 1, wherein the sensor device is a Wheatstone bridge array.

10. The sensor device of claim 1, wherein each second DFL sensor comprising a first SAF soft bias side shield, a second SAF soft bias side shield, and a first free layer and a second free layer disposed between the first and second SAF soft bias side shields, wherein the first SAF soft bias side shield comprises a first lower soft bias, a first spacer disposed on the first lower soft bias, and a first upper soft bias disposed on the first spacer, and wherein the second SAF soft bias side shield comprises a second lower soft bias, a second spacer disposed on the second lower soft bias, and a second upper soft bias disposed on the second spacer.

11. A sensor device, comprising:
   a first resistor comprising:
      at least one first dual free layer (DFL) sensor, each first DFL sensor comprising a first synthetic antiferromagnetic (SAF) soft bias side shield, a second SAF soft bias side shield, and a first free layer and a second free layer disposed between the first and second SAF soft bias side shields, wherein the first SAF soft bias side shield comprises a first lower soft bias, a first spacer disposed on the first lower soft bias, and a first upper soft bias disposed on the first spacer, and wherein the second SAF soft bias side shield comprises a second lower soft bias, a second spacer disposed on the second lower soft bias, and a second upper soft bias disposed on the second spacer; and
      at least one magnetic structure, wherein each magnetic structure comprises:
         a first permanent magnet; and
         SAF structure disposed over the first permanent magnet, wherein the at least one first DFL sensor is linearly aligned with the SAF structure when viewed in cross-section; and
   a second resistor comprising:
      at least one second DFL sensor; and
      at least one second permanent magnet, wherein the at least one second DFL sensor is linearly aligned with the at least one second permanent magnet when viewed in cross-section.

12. The sensor device of claim 11, wherein the at least one first DFL sensor is a plurality of first DFL sensors, each of the plurality of first DFL sensors being connected in series.

13. The sensor device of claim 11, wherein the at least one second DFL sensor is a plurality of second DFL sensors, each of the plurality of second DFL sensors being connected in series.

14. The sensor device of claim 11, wherein the SAF structure comprises:
   a first ferromagnetic layer;
   a spacer layer disposed over the first ferromagnetic layer; and
   a second ferromagnetic layer disposed over the spacer layer, wherein the at least one first DFL sensor is linearly aligned with the second ferromagnetic layer.

15. The sensor device of claim 11, wherein the at least one magnetic structure is a plurality of magnetic structures, wherein the at least one second permanent magnet is a plurality of second permanent magnets, wherein a number of the plurality of magnetic structures is equal to a number of the plurality of second permanent magnets.

16. The sensor device of claim 11, wherein the sensor device is a Wheatstone bridge array.

17. The sensor device of claim 11, wherein each second DFL sensor comprising a first SAF soft bias side shield, a second SAF soft bias side shield, and a first free layer and a second free layer disposed between the first and second SAF soft bias side shields, wherein the first SAF soft bias side shield comprises a first lower soft bias, a first spacer disposed on the first lower soft bias, and a first upper soft bias disposed on the first spacer, and wherein the second SAF soft bias side shield comprises a second lower soft bias, a second spacer disposed on the second lower soft bias, and a second upper soft bias disposed on the second spacer.

18. A sensor device, comprising:
at least one first resistor comprising:
  at least one first dual free layer (DFL) sensor, each first DFL sensor comprising a first synthetic antiferromagnetic (SAF) soft bias side shield, a second SAF soft bias side shield, and a first free layer and a second free layer disposed between the first and second SAF soft bias side shields, wherein the first SAF soft bias side shield comprises a first lower soft bias, a first spacer disposed on the first lower soft bias, and a first upper soft bias disposed on the first spacer, and wherein the second SAF soft bias side shield comprises a second lower soft bias, a second spacer disposed on the second lower soft bias, and a second upper soft bias disposed on the second spacer; and
  at least one first magnetic structure, wherein each first magnetic structure comprises:
    a first antiferromagnetic (AFM) layer comprising a first material; and
    a first ferromagnetic layer disposed over the first AFM layer; and
at least one second resistor comprising:
  at least one second DFL sensor; and
  at least one second magnetic structure, wherein each second magnetic structure comprises:
    a second AFM layer comprising a second material, wherein the second material is different from the first material; and
    a second ferromagnetic layer disposed over the second AFM layer.

19. The sensor device of claim 18, wherein the at least one first DFL sensor is linearly aligned with the first ferromagnetic layer when viewed in cross-section.

20. The sensor device of claim 19, wherein the at least one second DFL sensor is linearly aligned with the second ferromagnetic layer when viewed in cross-section.

21. The sensor device of claim 18, wherein the at least one first resistor is a plurality of first resistors and wherein the at least one second resistor is a plurality of second resistors.

22. The sensor device of claim 18, wherein the sensor device is a Wheatstone bridge array.

23. The sensor device of claim 18, wherein each second DFL sensor comprising a first SAF soft bias side shield, a second SAF soft bias side shield, and a first free layer and a second free layer disposed between the first and second SAF soft bias side shields, wherein the first SAF soft bias side shield comprises a first lower soft bias, a first spacer disposed on the first lower soft bias, and a first upper soft bias disposed on the first spacer, and wherein the second SAF soft bias side shield comprises a second lower soft bias, a second spacer disposed on the second lower soft bias, and a second upper soft bias disposed on the second spacer.

* * * * *